US008243502B2

(12) United States Patent
Sakimura et al.

(10) Patent No.: US 8,243,502 B2
(45) Date of Patent: Aug. 14, 2012

(54) NONVOLATILE LATCH CIRCUIT AND LOGIC CIRCUIT USING THE SAME

(75) Inventors: Noboru Sakimura, Tokyo (JP); Tadahiko Sugibayashi, Tokyo (JP); Ryusuke Nebashi, Tokyo (JP)

(73) Assignee: NEC Corporation, Tokyo (JP)

( * ) Notice: Subject to any disclaimer, the term of this patent is extended or adjusted under 35 U.S.C. 154(b) by 132 days.

(21) Appl. No.: 12/747,951

(22) PCT Filed: Nov. 19, 2008

(86) PCT No.: PCT/JP2008/070986
§ 371 (c)(1),
(2), (4) Date: Jul. 7, 2010

(87) PCT Pub. No.: WO2009/078242
PCT Pub. Date: Jun. 25, 2009

(65) Prior Publication Data
US 2010/0265760 A1    Oct. 21, 2010

(30) Foreign Application Priority Data

Dec. 14, 2007  (JP) ................................ 2007-324046

(51) Int. Cl.
*G11C 11/00* (2006.01)
(52) U.S. Cl. ......... 365/158; 365/148; 365/171; 365/173
(58) Field of Classification Search .................. 365/148, 365/158, 163, 171, 173, 48, 55, 62, 66, 74, 365/78, 80
See application file for complete search history.

(56) References Cited

U.S. PATENT DOCUMENTS

| 6,178,111 B1 * | 1/2001 | Sather et al. ................... 365/158 |
| 6,304,477 B1 * | 10/2001 | Naji ................................. 365/50 |
| 6,493,259 B1 * | 12/2002 | Swanson et al. .............. 365/158 |
| 2002/0034095 A1 * | 3/2002 | Lu et al. ......................... 365/158 |
| 2006/0083047 A1 * | 4/2006 | Fujita et al. .................... 365/145 |
| 2007/0247943 A1 * | 10/2007 | Sato et al. ....................... 365/210 |

FOREIGN PATENT DOCUMENTS

| JP | 63-136386 A | 6/1988 |
| JP | 5-218850 A | 8/1993 |
| JP | 8-191234 A | 7/1996 |
| JP | 2002511631 A | 4/2002 |

(Continued)

OTHER PUBLICATIONS

International Search Report for PCT/JP2008/070986 mailed Dec. 16, 2008.

*Primary Examiner* — Pho M Luu
*Assistant Examiner* — Thao Bui

(57) ABSTRACT

A nonvolatile latch circuit includes: a latch circuit; a first magnetoresistance element and a second magnetoresistance element; and a current supply portion. The latch circuit temporarily holds data. Each of the first magnetoresistance element and the second magnetoresistance element includes a first magnetic layer and a second magnetic layer that are stacked with an insulating film sandwiched therebetween. The current supply portion complementarily changes magnetization states of the first magnetoresistance element and the second magnetoresistance element based on a state of the latch circuit. The first magnetic layer of the first magnetoresistance element and the first magnetic layer of the second magnetoresistance element are series-connected to each other in. The latch circuit has a function that brings data corresponding to the magnetization states to data held by the latch circuit.

16 Claims, 19 Drawing Sheets

FOREIGN PATENT DOCUMENTS

| | | |
|---|---|---|
| JP | 2003157671 A | 5/2003 |
| JP | 2004088469 A | 3/2004 |
| JP | 2004206835 A | 7/2004 |
| JP | 2006526907 A | 11/2006 |
| JP | 2007207406 A | 8/2007 |
| JP | 2007258460 A | 10/2007 |
| WO | 03085741 A | 10/2003 |

* cited by examiner

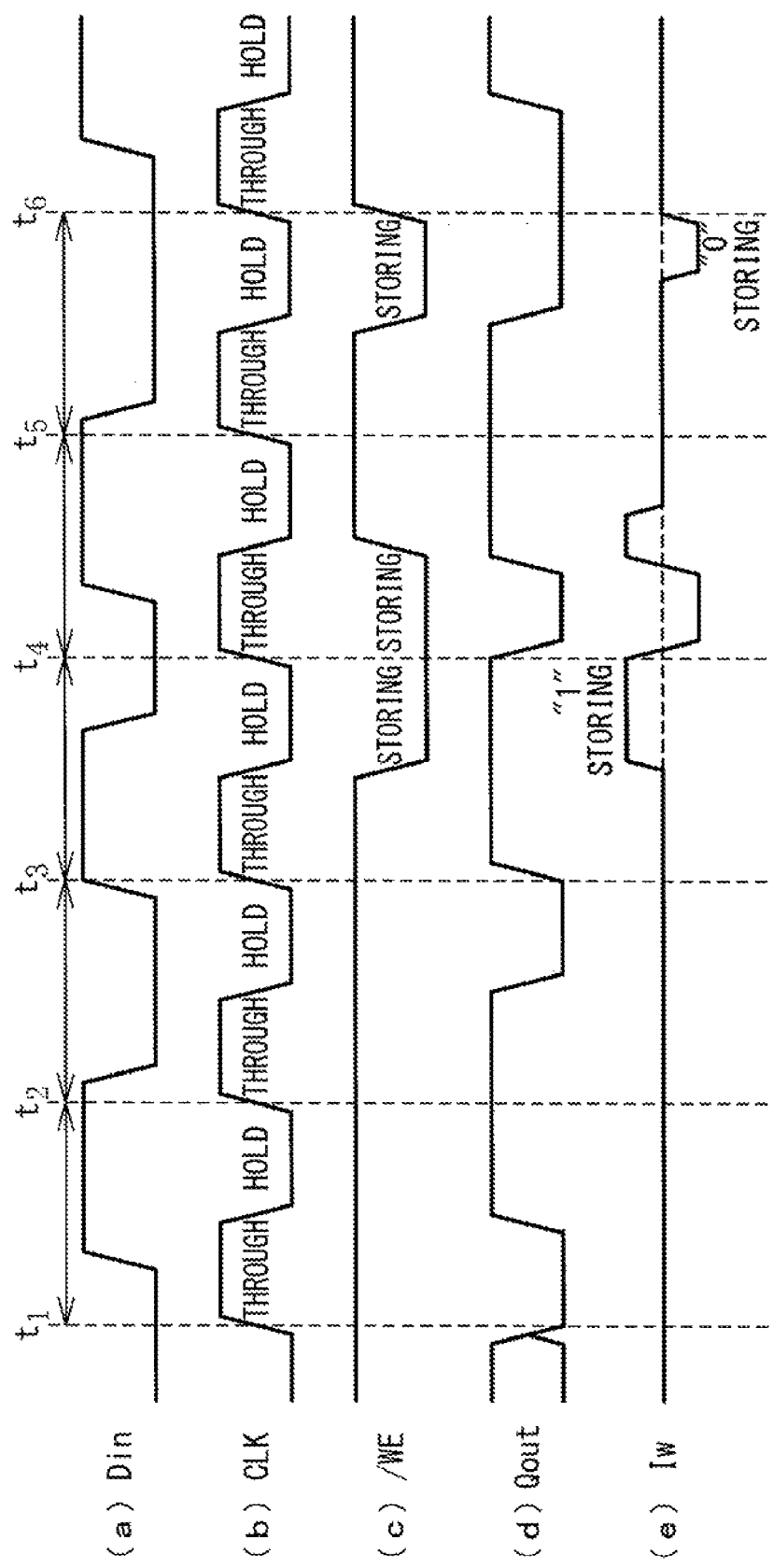

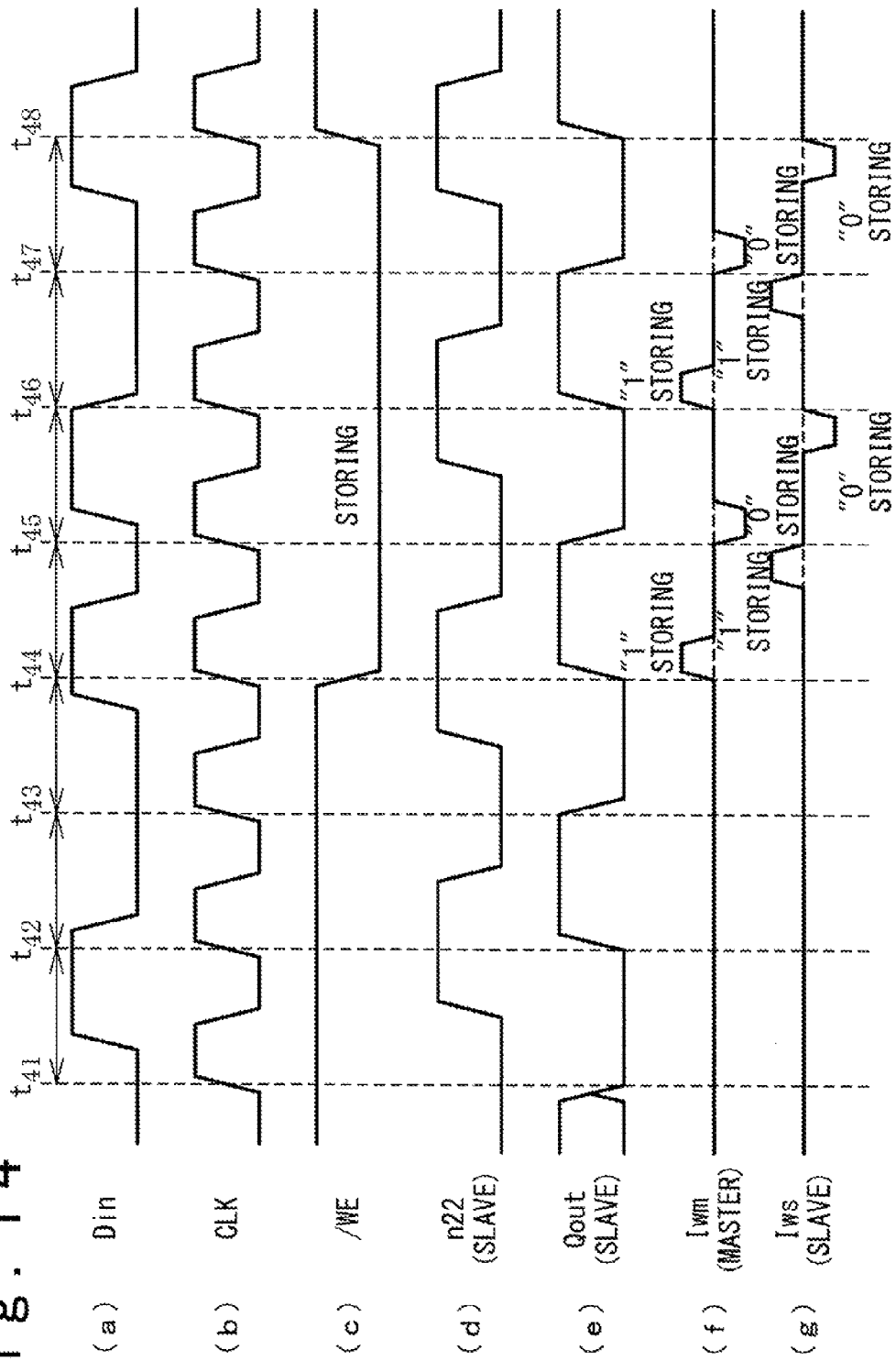

NONVOLATILE LATCH CIRCUIT AND LOGIC CIRCUIT USING THE SAME

This application is the National Phase of PCT/JP2008/070986, filed Nov. 19, 2008, which is based upon and claims the benefit of priority from Japanese patent application No. 2007-324046 filed on Dec. 14, 2007, the disclosure of which is incorporated herein in its entirety by reference.

TECHNICAL FIELD

The present invention relates to a nonvolatile latch circuit including a magnetoresistance element (MTJ: Magnetic Tunnel Junction) as a memory element, and a logic circuit using the nonvolatile latch circuit.

BACKGROUND ART

In a large-scale integrated circuit (LSI), a large number of logic circuits are used. The logic circuits are roughly classified into logic gates and bistable logic circuits. The logic gate is used to process a digital logic value, and represented by an inverter, an NAND gate, or an NOR gate. The bistable logic circuit is used to temporarily hold or store a digital logic value, and represented by any of various types of latch circuits, or any of various types of flip-flop circuits combining them. A typical LSI incorporates large numbers of logic gates and bistable logic circuits, which are combined with each other. In recent years, the LSI often simultaneously incorporates a memory core such as a random access memory (RAM) or a read only memory (ROM).

In the recent LSI, due to development of miniaturization technique in a manufacturing process, a huge number of logic circuits have been integrated. Along with this, an increase in operating power due to an increase in speed, and an increase in standby power represented by a leak current become problems. As one of solutions of the problems, there is known a method that stops supplying power to an unused circuit block or to an entire LSI. However, this method causes an initial data, intermediate process data, result data, or the like to disappear. For this reason, a procedure for, immediately before the stop of the power supply, transferring the processing data to a nonvolatile storage device is required. This causes power supply control to be complicated, and a component cost in a system to be increased. Also, at the time of a power failure due to lightening, or an instantaneous power failure due to an unforeseen accident or the like, the procedure for transferring the processing data may not be appropriately performed. Further, in a latch circuit or a flip-flop circuit, an initial data is arbitrary, and therefore an initializing operation of a logic circuit is required at the time of power-on, which is disadvantageous in that system activation is delayed.

As means adapted to solve the above-described problems, there is proposed a circuit innovation that can hold a state of the latch circuit or the flip-flop circuit even after the stop of the power supply. For example, Japanese Patent Publication No. JP-A-Heisei 5-218850 (corresponding to U.S. Pat. No. 5,486,774A) proposes a flip-flop circuit that uses a virtual power supply through a power supply switch. Upon operation, the flip-flop circuit brings the power supply switch into an ON state, and operates with both of a main power supply and the virtual power supply to keep high-speed performance. Upon standby, the power supply switch is brought into an OFF state, and the virtual power supply is interrupted to hold a state of the flip-flop circuit only with the main power supply. This enables a reduction in power to be expected.

As a means adapted to solve the above-described problems, there is also proposed a method that combines a flip-flop circuit and a nonvolatile memory element. For example, Japanese Patent Publication No. JP2004-88469A (corresponding to U.S. Pat. No. 7,080,270B2) proposes a circuit that stores a state of a flip-flop circuit in a ferroelectric capacitor. In the circuit, an output of an inverter used for the flip-flop circuit is connected with the ferroelectric capacitor, and it is not necessary to separately provide a writing means. For example, Japanese Translation of PCT No. 2002-511631 (corresponding to European Patent Publication No. EP1,072,040A1), Japanese Patent Publication No. JP2003-157671A, or Japanese Patent Publication No. JP2004-206835A (corresponding to US Patent Publication No. US2004/125660A1) proposes a circuit that stores a state of a latch circuit in a magnetoresistance element (e.g.: MTJ element). In the circuit, between an inverter of the latch circuit and a power supply, the MTJ element is inserted, and writing means adapted to store a state of a flip-flop circuit in the MTJ element is provided. It is generally said that the number of rewrites in the MTJ element is infinite ($10^{15}$ times or more). Accordingly, the circuit can constantly perform the store operation. Also, the writing can be performed as quick as a few nano-seconds or less. Further, the MTJ element is deposited in a wiring line manufacturing process, and therefore can be stacked just above a transistor. Accordingly, an overhead of a cell layout area may be able to be suppressed.

As a related technique, Japanese Patent Publication No. JP2007-207406A (corresponding to US Patent Publication No. US2007/159876A1) discloses a semiconductor memory device. The semiconductor memory device is provided with: a memory cell array including memory cells arranged in a matrix; and a sense amplifier circuit. Each of the memory cells includes at least one magnetoresistance element storing data, and amplifying means adapted to amplify potential generated by current flowing through the magnetoresistance element. The sense amplifier circuit identifies the data stored in the magnetoresistance element in response to output of the amplifying means.

Also, Japanese Translation of PCT No. 2006-526907 (corresponding to US Patent Publication US2007/164781A1) describes a component having a logic circuit device that can configure a function. The component has the logic circuit device capable of configuring the function, and includes a plurality of data lines (7). In the component, at least one part of the data lines (7) is related to at least one element (1) that can switch between two states respectively having different discrete resistances, and the component is characterized in that according to a state switched through the element (1), the data line (7) is opened or interrupted; at the time, a switched state of the element (1) can be stored with being nonvolatile; and the switching can be quickly made.

Further, International Patent Publication No. WO2003/085741 (corresponding to US Patent Publication US2004141363A1) discloses a nonvolatile flip-flop. The nonvolatile flip-flop includes a flip-flop unit having a pair of storage nodes for storing a pair of reverse logic data, and a pair of non-volatile resistance change elements respectively connected to the pair of storage nodes and changing their resistances in such a manner that they can be stored. In the store operation, the resistances of the pair of non-volatile resistance change elements are changed according to potentials of the pair of storage nodes, and in recall operation, each of the pair of storage nodes can be set to a potential corresponding to a difference between the resistances of the pair of non-volatile resistance change elements.

Still further, Japanese Patent Publication No. JP-A-Heisei 8-191234 discloses a D flip-flop circuit. In the D flip-flop circuit, a master includes a first inverter (I1) constituting a feedforward path, a second inverter (I2) constituting a feedback path, and first transfer gate (TG1); a slave includes a third inverter (I3) constituting a feedforward path, a fourth inverter (I4) constituting a feedback path, and a second transfer gate (TG2); a third transfer gate (TG3) is provided between an input terminal of the D flip-flop circuit and the first inverter (I1); a fourth transfer gate (TG4) is provided between the master and the slave; the second and third transfer gates (TG2 and TG3) are controlled by a first control signal (S1); and the first and fourth transfer gates (TG1 and TG4) are controlled by a second control signal (S2) having a phase opposite to that of the first control signal (S1).

The D flip-flop circuit is characterized by including: a fifth transfer gate (TG5) that interrupts the feedback path of the master when the D flip-flop circuit returns from power save; a sixth transfer gate (TG6) that interrupts the feedback path of the slave when the D flip-flop circuit returns from the power save; a positive terminal; and a negative terminal, and having: a storage circuit (M1) that outputs a true value to the positive terminal and a value opposite to the true value to the negative terminal for data written from the positive terminal, and outputs a true value to the negative terminal and a value opposite to the true value to the positive terminal for data written from the negative terminal, wherein the master and the slave are supplied with power supplies different from each other; a seventh transfer gate (TG7) that interrupts a path between a negative terminal of the storage circuit (M1) and an input terminal of the first inverter (I1) when the D flip-flop circuit is in the power save; an eighth transfer gate (TG8) that interrupts a path between a positive terminal of the storage circuit (M1) and an input terminal of the third inverter (I3) when the D flip-flop circuit is in the power save; and a ninth transfer gate (TG9) that interrupts the path between the negative terminal of the storage circuit (M1) and the input terminal of the first inverter (I1) when the master and the slave are interrupted by the second control signal (S2).

Yet further, Japanese Patent Publication No. JP-A-Showa 63-136386 (corresponding to U.S. Pat. No. 4,751,677) describes a multiple magnetic structures memory cell. The multiple magnetic structures memory cell includes: a plurality of storage structures including a first storage structure and a second storage structure; first and second impedance means; and first and second switching means.

In the latch circuit or the flip-clop circuit using a power supply switch and a virtual power supply, a special manufacturing process for a memory element is not required. However, the main power supply is not stopped, and therefore it is necessary to use a transistor having a high threshold voltage to prevent an increase in a gate leak current or a sub-threshold leak current. Also, three power supply lines, i.e., a main power supply line, a virtual power supply line, and ground line, are required, which complicates layout, and therefore it is difficult to make a design with an automatic layout tool. Accordingly, there is a problem of art increase in design cost.

In the latch circuit or the flip-flop circuit using a ferroelectric capacitor, a high temperature process is required to manufacture the ferroelectric capacitor. Accordingly, it is difficult to stack the ferroelectric capacitor on a wiring layer. For this reason, it is necessary to form the ferroelectric capacitor on a semiconductor substrate, which increases a cell area of the flip-flop circuit. Also, upon a store operation, a load capacitance of an inverter used for the flip-flop circuit is increased. Further, a time for writing to the ferroelectric capacitor requires a few tens nano-seconds, and therefore operating speed is reduced. Still further, it is necessary to wire a low impedance plate line to one of terminals of the ferroelectric capacitor, and therefore it may be difficult to make a design with an automatic layout tool.

In the latch circuit or the flip-flop circuit using a magnetoresistance element (e.g.: MTJ element), current flows through a wiring layer positioned below or above the MTJ element, and a magnetization direction of the MTJ element is reversed by a magnetic field generated by the current to perform writing. An efficiency for generating the magnetic field by current flowing is low, and typically a current of a few mA is required. Accordingly, a size of a transistor used for a current supplying means used also for the latch circuit is increased, and an increase in a cell area of the flip-flop is inevitable. Further, a signal amount (a difference between low and high resistive states) of the MTJ element is as small as 100% or less. Upon recall operation, inputs/outputs of inverters cross-coupled to each other are short-circuited to perform reading with a combined resistance of an ON resistance of a transistor and a resistance of the MTJ element, and therefore the signal amount is further reduced. For this reason, considering a variation in a threshold voltage of the transistor and a variation in resistance of the MTJ element, it is not easy to normally perform the recall operation.

DISCLOSURE OF INVENTION

An object of the present invention is to provide a nonvolatile latch circuit using a magnetoresistance element, in which even after power supply has been stopped/interrupted, a state of the latch circuit or the flip-flop circuit can be efficiently held with high reliability, and a logic circuit using the nonvolatile latch circuit.

This and other objects, features and advantages of the present invention will be readily ascertained by referring to the following description and drawings.

A first nonvolatile latch circuit of the present invention includes a latch circuit, a first magnetoresistance element, a second magnetoresistance element, and current supply portion. The latch circuit temporarily holds data. Each of the first magnetoresistance element and the second magnetoresistance element includes a first magnetic layer and a second magnetic layer that are stacked with an insulating film sandwiched therebetween. The current supply portion complementarily changes magnetization states of the first magnetoresistance element and the second magnetoresistance element based on a state of the latch circuit. The first magnetic layer of the first magnetoresistance element and the first magnetic layer of the second magnetoresistance element are connected to each other in series. The latch circuit has a function that brings data corresponding to the magnetization states to data held by the latch circuit.

A first logic circuit of the present invention includes a circuit and a nonvolatile latch circuit. The circuit outputs data. The nonvolatile latch circuit is the above-described nonvolatile latch circuit that temporarily holds data.

BRIEF DESCRIPTION OF THE DRAWINGS

FIG. 6 is a timing chart illustrating a normal operation of the nonvolatile latch circuit according to the first embodiment of the present invention;

FIG. 14 is a timing chart illustrating a normal operation of the nonvolatile latch circuit according to the third embodiment of the present invention;

BEST MODE FOR CARRYING OUT THE INVENTION

Embodiments of a nonvolatile latch circuit of the present invention and a logic circuit using the same will be described below referring to the accompanying drawings.

First Embodiment

Figure 1:
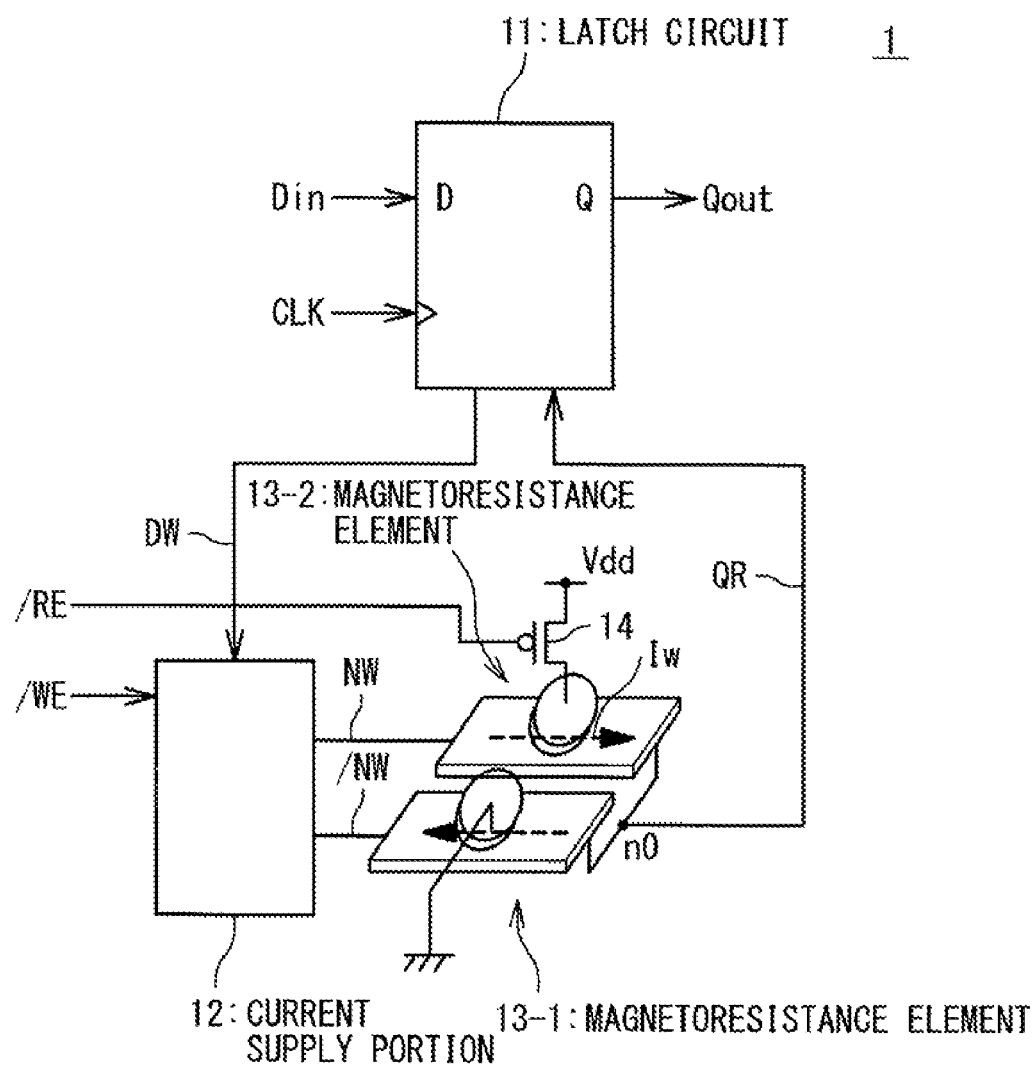
FIG. 1 is a schematic configuration diagram illustrating a configuration of a nonvolatile latch circuit according to an embodiment of the present invention.

A configuration of a nonvolatile latch circuit according to a first embodiment of the present invention will be described. FIG. 1 is a schematic configuration diagram illustrating the configuration of the nonvolatile latch circuit according to the first embodiment of the present invention. The nonvolatile latch circuit 1 is a nonvolatile latch circuit using a magnetoresistance element exemplified by an MTJ element. The nonvolatile latch circuit 1 includes a latch circuit 11, two magnetoresistance elements 13-1 and 13-2, and a current supply portion 12.

During a time period that a clock signal CLK is at a high level (or a low level), the latch circuit 11 temporarily holds (latches) input data Din supplied from another circuit (not illustrated) within a logic circuit. Then, the latch circuit 11 outputs the latched data (latch data) as output data Qout. Also, the latch circuit 11 supplies a data signal DW (or an inverted signal /DW of the data signal DW) indicating the latch data to the current supply portion 12. Also, upon a recall operation, the latch 11 receives an output QR based on data stored in the two magnetoresistance elements 13-1 and 13-2.

The current supply portion 12 receives the data signal DW (or the inverted signal /DW of the data signal DW) from the latch circuit 11. Then, at timing that a store enable signal /WE is activated, the current supply portion 12 applies complementary voltages to terminals NW and /NW in response to the data signal DW. On the basis of this, magnetization reversal current Iw flowed through the two magnetoresistance elements 13-1 and 13-2 in different directions in response to the data signal DW.

Each of the magnetoresistance elements 13-1 and 13-2 is exemplified by an MTJ element, and has three terminals in total, i.e., one upper terminal and two lower terminals.

In the magnetoresistance element 13-1, the upper terminal is connected to one of a ground and a switch 14 (e.g.: p-channel transistor). One of the lower terminals is connected to the terminal /NW of the current supply portion 12. The other lower terminal is connected to the other lower terminal of the magnetoresistance element 13-2 through a node n0. In the magnetoresistance element 13-2, the upper terminal is connected to one of a power supply voltage Vdd through the switch 14 and the ground. One of the lower terminals is connected to the terminal NW of the current supply portion 12. The other lower terminal is connected to the other lower terminal of the magnetoresistance element 13-1 through the node n0.

In the magnetoresistance elements 13-1 and 13-2, magnetizations respectively having directions opposite to each other are written by the magnetization reversal current Iw from the current supply portion 12. That is, complementary data corresponding to the data signal DW are written to the magnetoresistance elements 13-1 and 13-2. In this manner, the latch data of the latch circuit 11, i.e., one bit data corresponding to the output data Qout is transferred to the two magnetoresistance elements 13-1 and 13-2, and stored as complementary magnetization states of them.

Figure 2A:
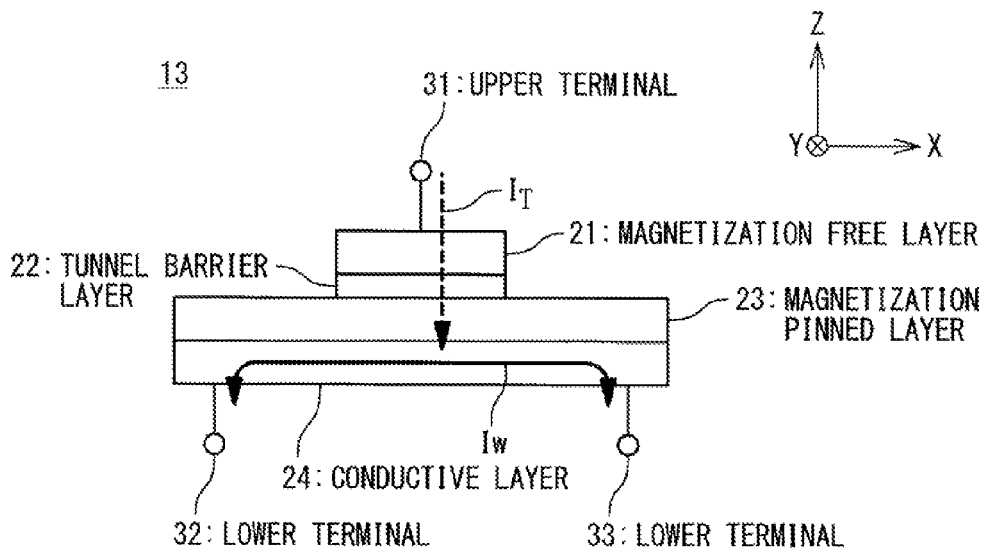
FIG. 2A is a cross-sectional view illustrating a configuration example of a magnetoresistance element according to the embodiment of the present invention.
Figure 2B:
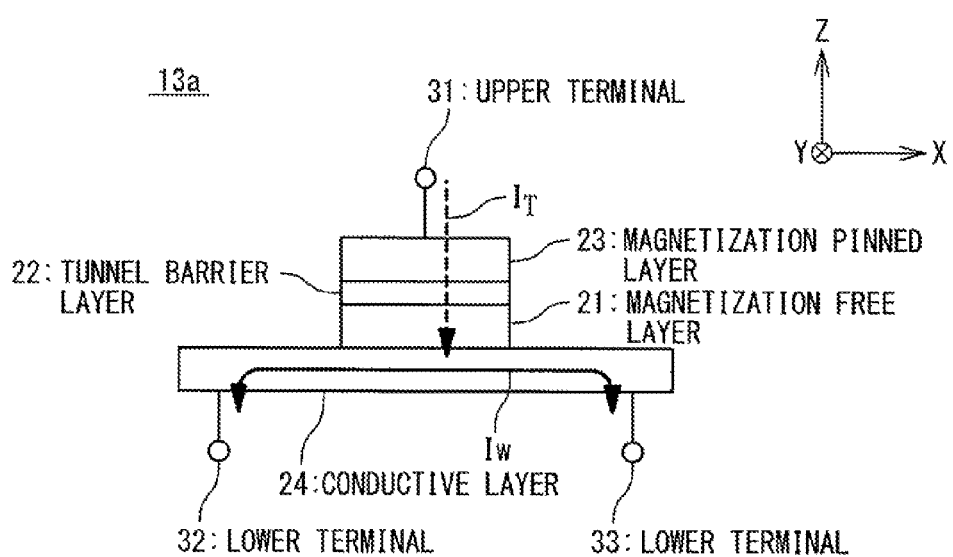
FIG. 2B is a cross-sectional view illustrating another configuration example of the magnetoresistance element according to the embodiment of the present invention.
Figure 2C:
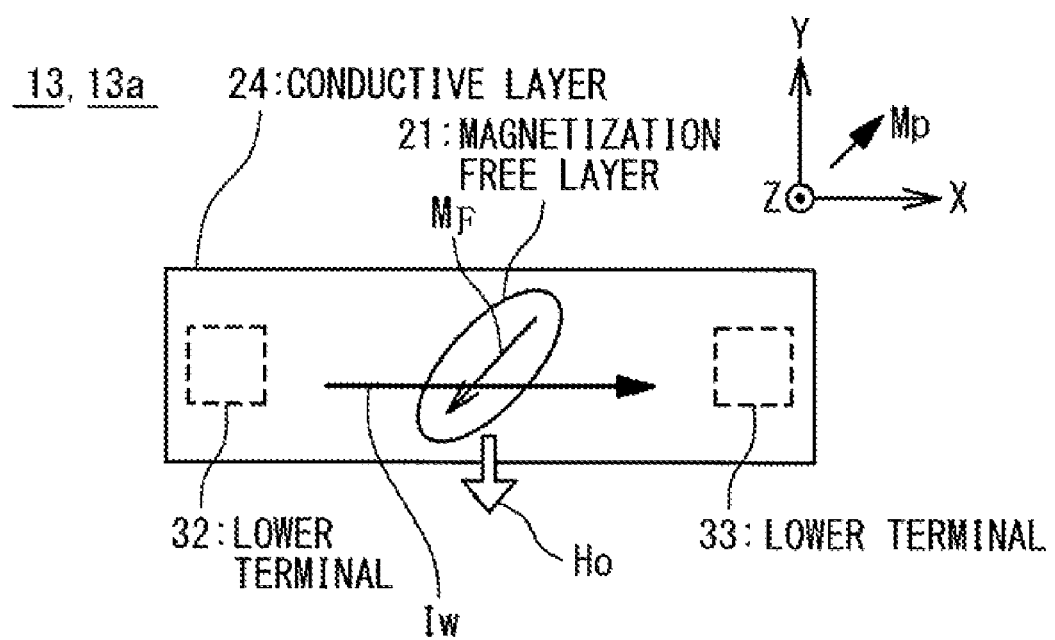
FIG. 2C is a plan view illustrating the configuration example and another configuration example of the magnetoresistance element according to the embodiment of the present invention.

FIGS. 2A to 2C are cross-sectional views and a plan view illustrating configuration examples of the magnetoresistance element according to the present embodiment. FIGS. 2A, 2B, and 2C respectively illustrate a cross-sectional view of one example of the magnetoresistance element, a cross-sectional view of another example of the magnetoresistance element, and a plan view common to the magnetoresistance elements of FIGS. 2A and 2B. In the following, referring to these diagrams, there is described a principle of reversing a magnetization state of a magnetization free layer by a magnetic field generated by the magnetization reversal current Iw.

The magnetoresistance element 13 (common to 13-1 and 13-2) of FIG. 2A is provide with an electrically conductive layer 24, a magnetization pinned layer 23, a tunnel barrier layer 22, and a magnetization free layer 21. The electrically conductive layer 24 is a layer having electrically conductive property, and provided with lower terminals 32 and 33 at both ends thereof. The magnetization pinned layer 23 is a layer that the magnetization $M_P$ is pinned, and directly stacked on an upper surface of the electrically conductive layer 24. The tunnel barrier layer 22 is an insulating or nonmagnetic layer, and stacked on an upper surface of the magnetization pinned layer 23 in a shape smaller than that of the magnetization pinned layer 23. The magnetization free layer 21 is a layer that the magnetization $M_F$ is reversible to being parallel or anti-parallel to the magnetization $M_P$, and stacked on an upper surface of the tunnel barrier layer 22. The magnetization free layer 21 is provided with an upper terminal 31 on an upper surface thereof.

The magnetization reversal current Iw flows through the electrically conductive layer 24 from any one of the lower terminals 32 and 33 to the other one in a direction that is different depending on write data. The write data corresponds to the data signal DW. In this case, by providing the electrically conductive layer 24 just under the magnetization pinned layer 23, a distance between the electrically conductive layer 24 and the magnetization free layer 21 can be shortened to only a few 10 s nm. For this reason, the magnetization reversal current Iw can be set to 1 mA or less.

The magnetoresistance element 13a (common to 13-1 and 13-2) of FIG. 2B is provided with the electrically conductive layer 24, the magnetization pinned layer 23, the tunnel barrier layer 22, and the magnetization free layer 21. These are basically the same as those of the magnetoresistance element 13, but different in a stacking order and a partial shape. That is, the magnetization free layer 21 is directly stacked on an upper surface of the electrically conductive layer 24 in a shape smaller than that of the electrically conductive layer 24. The tunnel barrier layer 22 is stacked on an upper surface of the magnetization free layer 21. Further, the magnetization pinned layer 23 is stacked on an upper surface of the tunnel barrier layer 22. In this case, by providing the electrically conductive layer 24 just under the magnetization free layer 21, a distance between the electrically conductive layer 24 and the magnetization free layer 21 can be brought close to the limit. For this reason, the magnetization reversal current Iw can be further reduced.

FIG. 2C illustrates the plan view of the magnetoresistance element illustrated in FIG. 2A or 2B. Note that, in the diagram, the magnetization pinned layer 23 and the tunnel barrier layer 22 are omitted. A direction of the magnetization $M_P$ of the magnetization pinned layer 23, and a direction of the magnetization $M_F$ of the magnetization free layer 21 are tilted at an angle of 45 degrees with respect to a direction (X direction) parallel to a longer direction of the electrically conductive layer 24. The magnetization directions of the magnetizations $M_P$ and $M_F$ can be freely set unless they are parallel to the X direction. For example, 30, 45, 60, or 90 degrees or the like with respect to the X direction is possible. In FIG. 2C, the magnetization $M_P$ of the magnetization pinned layer 23 is assumed to be pinned with being tilted at an angle of 45 degrees from a +X direction to a +Y direction. In this case, if the magnetization reversal current Iw flows through the electrically conductive layer 24 in a direction from a −X direction to the +X direction, a magnetic field $H_0$ applied to the magnetization free layer 21 faces downward; the magnetization $M_P$ of the magnetization pinned layer 23 and the magnetization $M_F$ of the magnetization free layer 21 are brought into states antiparallel to each other; and the magnetoresistance element 13 or 13a are brought into a high resistive state (data "1") (state in FIG. 2C). Similarly, if the magnetization reversal current Iw flows through the electrically conductive layer 24 in a direction from the +X direction to the −X direction, the magnetic field $H_0$ applied to the magnetization free layer 21 faces upward; the magnetizations $M_P$ and $M_F$ are brought into states parallel to each other; and the magnetoresistance element 13 or 13a are brought into a low resistive state (data "0") (not illustrated).

Figure 3A:
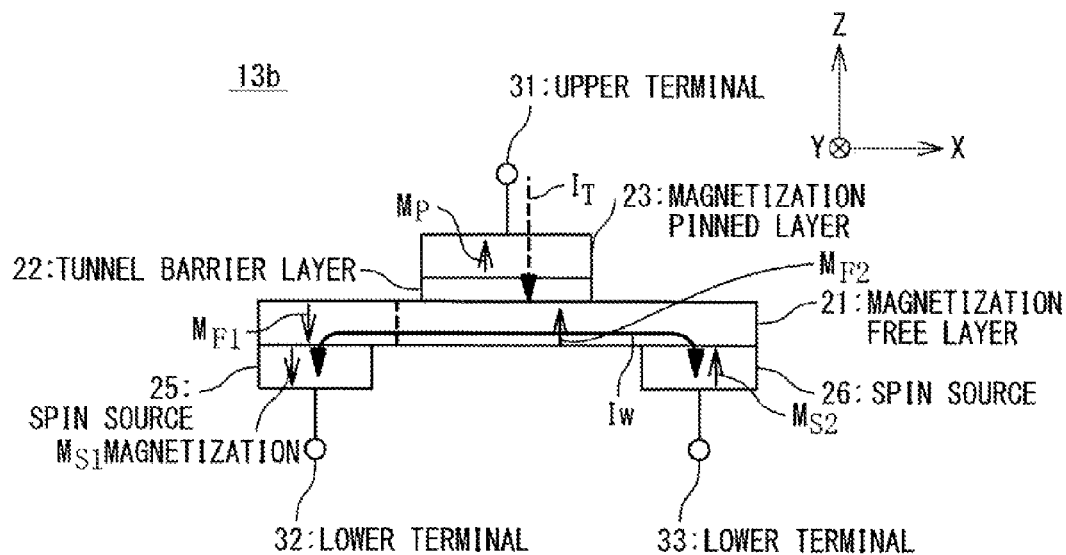
FIG. 3A is a cross-sectional view illustrating a still another configuration example of the magnetoresistance element according to the embodiment of the present invention.
Figure 3B:
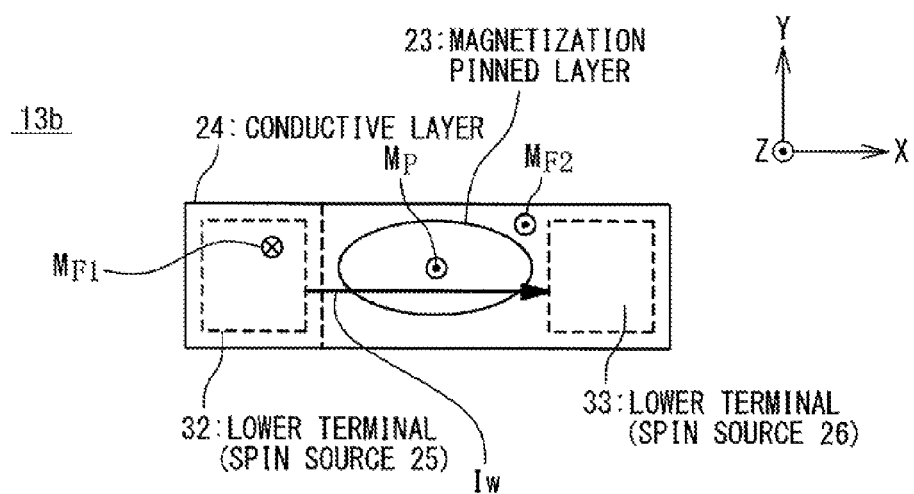
FIG. 3B is a plan view illustrating the still another configuration example of the magnetoresistance element according to the embodiment of the present invention.

FIGS. 3A and 3B are cross-sectional and plan views illustrating still another configuration example of the magnetoresistance element according to the present embodiment. FIGS. 3A and 3B respectively illustrate the cross-sectional view of still another example of the magnetoresistance element, and the plan view of the still another example of the magnetoresistance element. In the following, referring to the diagrams, there is described a principle of reversing a magnetization state of a magnetization free layer by spin of electrons in the magnetization reversal current Iw.

As illustrated in FIG. 3A, a magnetoresistance element 13b (common to 13-1 and 13-2) is provided with spin sources 25 and 26, the magnetization free layer 21, the tunnel barrier layer 22, and the magnetization pinned layer 23. The spin sources 25 and 26 are respectively connected to both ends of the magnetization free layer 21 on upper surfaces thereof. The spin sources 25 and 26 are respectively provided with lower terminals 32 and 33 on lower surfaces thereof. The tunnel barrier layer 22 is stacked on an upper surface of the magnetic free layer 21 in a shape smaller than that of the magnetization free layer 23. The magnetization pinned layer 23 is stacked on an upper surface of the tunnel barrier layer 22. The magnetization pinned layer 23 is provided with an upper terminal 31 on an upper surface thereof.

In respective magnetic layers, i.e., in the spin sources 25 and 26, the magnetization free layer 21, and the magnetization pinned layer 23, magnetization directions of them are vertical (Z direction). Magnetization $M_P$ of the magnetization pinned layer 23 is pinned in a +Z direction. Magnetization $M_{S1}$ of the spin source 25 is pinned in a −Z direction, and magnetization $M_{S2}$ of the spin source 26 is pinned in the +Z direction. The magnetization free layer 21 is divided into a region that the magnetization $M_F$ thereof faces to the −Z direction (magnetization $M_{F1}$) and a region that the magnetization $M_F$ thereof faces to the +Z direction (magnetization $M_{F2}$) with a domain wall DW generated adjacent to any of the spin sources 25 and 26 serving as a boundary. For example, as shown in FIG. 3B, if the magnetization reversal current Iw flows from a −X direction to a +X direction through the spin source 25, the magnetization free layer 21, and the spin source 26, the domain wall DW in the magnetization free layer 21, which is present adjacent to the spin source 26 on the +X side, moves in the −X direction due to spin torque action by the electrons in the magnetization reversal current Iw, and remains adjacent to the spin source 25 on the −X side. As a result, the magnetization $M_F$ of the magnetization free layer 21 just below the magnetization pinned layer 23 comes to the magnetization $M_{F2}$, which has the same direction (parallel state) as that of the magnetization $M_P$ of the magnetization pinned layer 23, and thereby the magnetoresistance element 13b is brought into the low resistive state (data "0"). Similarly, if the magnetization reversal current Iw flows from the +X direction to the −X direction through the spin source 26, the magnetization free layer 21, and the spin source 25, the domain wall DW in the magnetization free layer 21, which is present adjacent to the spin source 25 on the −X side, moves in the +X direction due to the spin torque action by the electrons in the magnetization reversal current Iw, and remains adjacent to the spin source 26 on the +X side. As a result, the magnetization $M_F$ of the magnetization free layer 21 just below the magnetization pinned layer 23 comes to the magnetization $M_{F1}$, which has a direction (antiparallel state) opposite to that of the magnetization $M_P$ of the magnetization pinned layer 23, and thereby the magnetoresistance element 13b is brought into the high resistive state (data "1"). According to the present magnetoresistance element 13b, the magnetization reversal current Iw can be reduced to approximately a few 100 s μA, and consequently an area overhead of the current supply portion 12 can be suppressed.

Any of the three-terminal magnetoresistance elements 13, 13a, and 13b exemplified above in FIGS. 2A to 2C, 3A, and 3B is applied to the nonvolatile latch circuit 1 illustrated in FIG. 1 as the two magnetoresistance elements 13-1 and 13-2. Note that the lower terminals 32 at one ends of the two magnetoresistance elements 13 (or 13a, or 13b) are electrically connected to the terminals /NW and NW of the current supply portion 12, respectively, and the other lower terminals 33 are electrically connected to each other. The upper terminal 31 of one of the magnetoresistance elements 13 is connected to a power supply voltage (Vdd) through the switch 14, and the upper terminal 31 of the other magnetoresistance element 13 is grounded (although not illustrated, may be grounded through a switch). As the above switch, 14, a p-channel transistor is used in FIG. 1.

Figure 4:
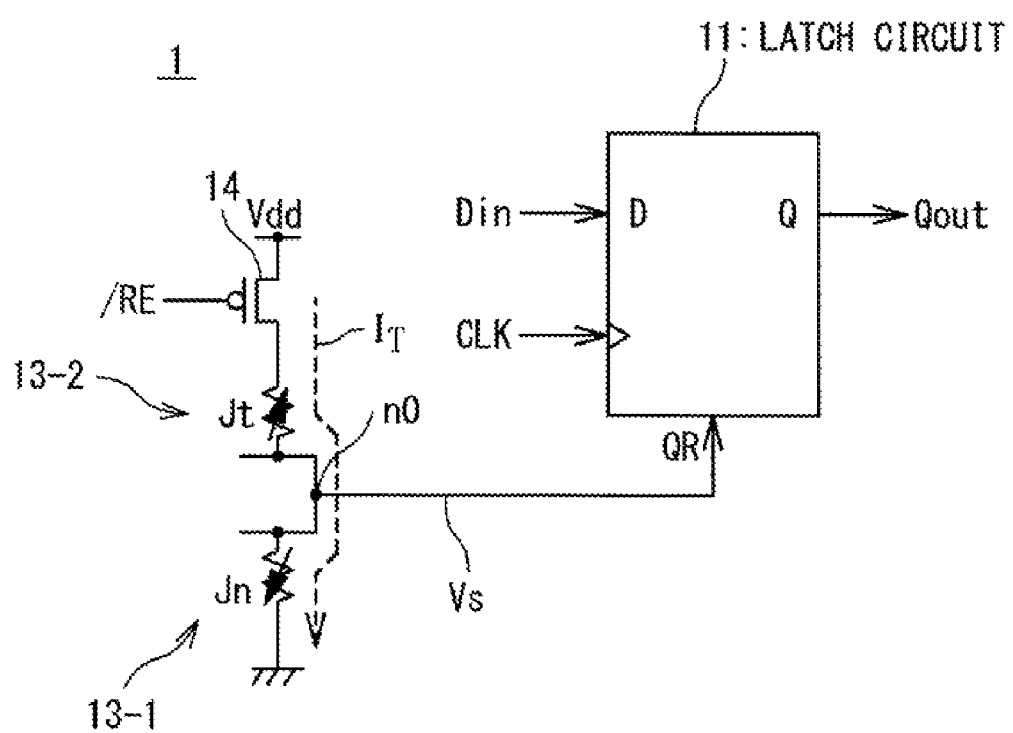
FIG. 4 is an equivalent circuit illustrating a recall operation of the nonvolatile latch circuit according to the embodiment of the present invention.

FIG. 4 is an equivalent circuit illustrating the recall operation of the nonvolatile latch circuit according to the embodiment of the present invention. The recall operation refers to an operation of transferring the one bit data stored in the two magnetoresistance elements 13-1 and 13-2 to the latch circuit 11. When a recall enable signal /RE is activated, the p-channel transistor as the switch 14 is brought into an ON state, and thereby between the power supply voltage Vdd and the ground Gnd, a series current path of the two magnetoresistance elements 13-2 and 13-1 is formed. Through tunnel junctions Jt and Jn of the two magnetoresistance elements 13-2 and 13-1 in the series current path, a tunnel current $I_T$ flows. On the other hand, at the node n0 between the two magnetoresistance elements 13-2 and 13-1, a voltage Vs corresponding to the magnetization states (resistive states) of the magnetoresistance elements 13-2 and 13-1 (tunnel junctions Jt and Jn) is generated. The voltage Vs is supplied to the latch circuit 11 as the output QR.

Specifically, the voltage Vs is, for example, as follows:

In the case where the magnetoresistance elements 13-1 and 13-2 are respectively in the low and high resistive states (Rlow and Rhigh), the voltage Vs is given by:

$$Vs = Vdd \cdot Rlow/(Rlow + Rhigh) < Vdd/2 \quad (1)$$

On the other hand, in the case where the magnetoresistance elements 13-1 and 13-2 are respectively in the high and low resistive states, the voltage Vs is given by:

$$Vs = Vdd \cdot Rhigh/(Rlow + Rhigh) > Vdd/2 \quad (2)$$

The voltage Vs represented by the expression (1) or (2) is transferred to the latch circuit 11, and then amplified to a logical amplitude level.

In this manner, the one bit data stored as the magnetization states of the magnetoresistance elements 13-1 and 13-2 (tunnel junctions Jt and Jn) is transferred to the latch circuit 11. Note that the voltage Vs is determined almost only by resistance values of the magnetoresistance elements 13-2 and 13-1, and therefore even if a signal amount between the magnetoresistance elements 13-2 and 13-1 is 100% or less, the recall operation can be performed with high reliability. As described above, according to the nonvolatile latch circuit of the present embodiment, even if a power supply is brought into a non-supply state, and data held by the latch circuit 11 is lost, the data can be again extracted by detecting the magnetization states of the magnetoresistance elements.

Next, the nonvolatile latch circuit according to the present embodiment is specifically described referring to FIGS. 5A to 7.

Figure 5A:
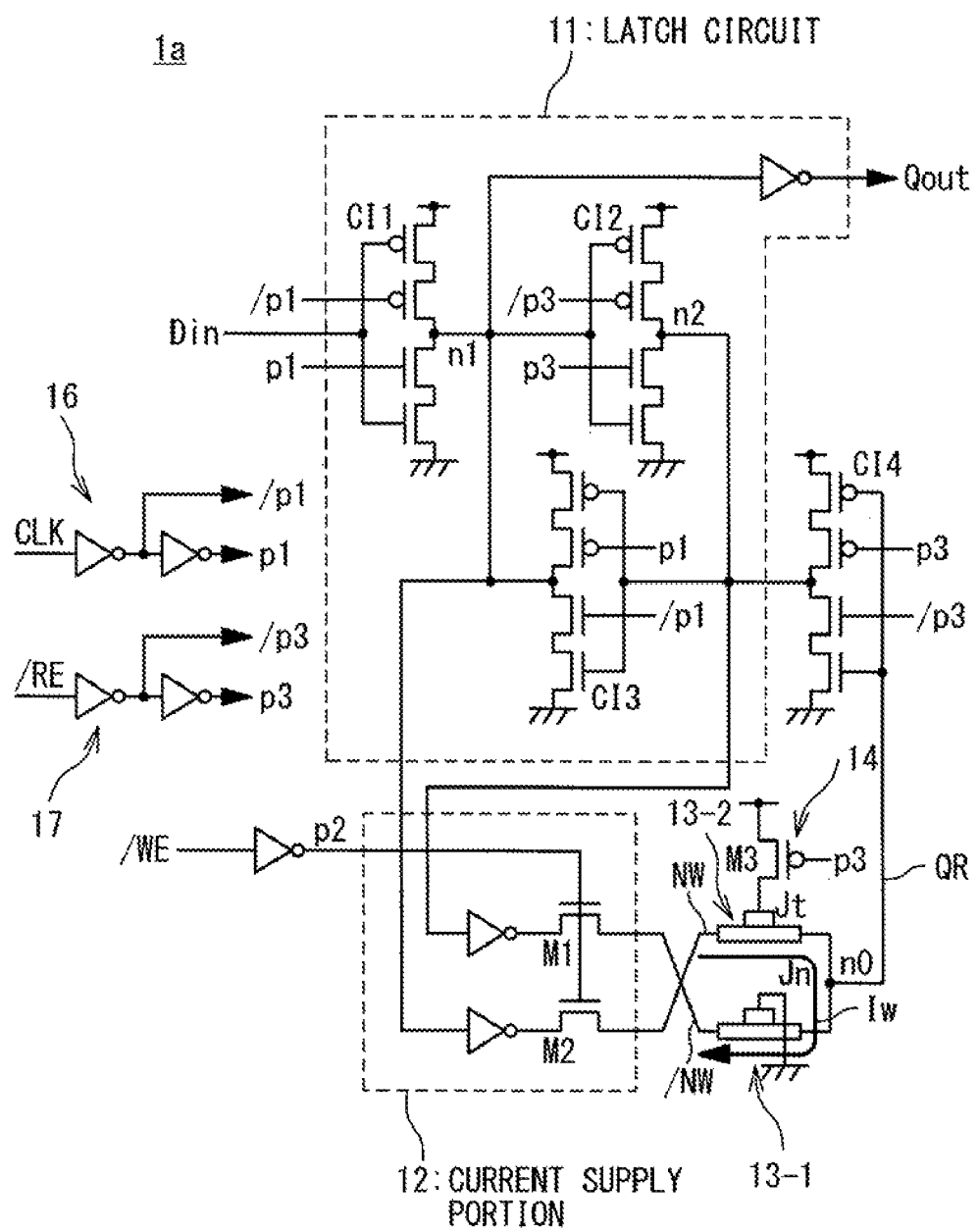
FIG. 5A is a circuit diagram illustrating a specific example of the nonvolatile latch circuit according to the first embodiment of the present invention.

FIG. 5A is a circuit diagram illustrating a specific example of the nonvolatile latch circuit according to the present embodiment. The nonvolatile latch circuit 1a is a nonvolatile high through latch circuit using magnetoresistance elements. As will be described later, FIG. 5A illustrates a state of a store operation in the normal operation. The nonvolatile latch circuit 1a includes the latch circuit 11, the current supply portion 12, signal conversion portions 16 and 17, a clocked inverter CI4, and the magnetoresistance elements 13-1 and 13-2.

The latch circuit 11 includes clocked inverters CI1, CI2, and CI3. The clocked inverter CI1 is supplied with the input data Din and the clock signals p1 and /p1, and on the basis of them, outputs a signal to a node n1. The clocked inverter CI2 is supplied with the signal at the node n1 and recall enable signals p3 and /p3, and on the basis of them, outputs a signal to a node n2. The clocked inverter CI3 is supplied with the signal at the node n2 and the clock signals p1 and /p1, and on the basis of them, outputs a signal to the node n1. The node n1 is also connected to a terminal outputting the output data Qout and the current supply portion 12. The node n2 is also connected to the current supply portion 12 and the clocked inverter CI4. The signal at the node n1 or n2 corresponds to the data signal DW (or an inverted signal /DW of the data signal DW).

The current supply portion 12 is, upon a write operation to the magnetoresistance elements 13-1 and 13-2, supplied with an inverted signal p2 of the store enable signal /WE and inverted signals of the signals (corresponding to data signals DW and /DW) at the node n1 and n2. Then, on the basis of them, the current supply portion 12 supplies the magnetization reversal current Iw in a forward or reverse direction through the DC current path via the magnetoresistance elements 13-1 and 13-2.

The signal conversion portion 16 converts the clock signal CLK to the clock signals /p1 and p1 respectively obtained by inverting the clock signals CLK and /p1, and then outputs them. The signal conversion portion 17 converts the recall enable signal /RE to the recall enable signals /p3 and p3 respectively obtained by inverting the recall enable signals /RE and /p3, and then outputs them. The clocked inverter CI4 is supplied with the recall enable signals p3 and /p3 and the output QR corresponding to the voltage Vs at the node n0. Then, on the basis of them, the clocked inverter CI4 outputs a signal to the node n2.

Note that the signal conversion portions 16 and 17 and the clocked inverter CI4 may be included in the latch circuit 11. Also, the magnetoresistance elements 13-1 and 13-2 are as has already been described.

Next, referring to FIGS. 5A and 6, the normal operation (including the store operation) of the nonvolatile latch circuit 1a in FIG. 5A is described. FIG. 6 is a timing chart illustrating the normal operation of the nonvolatile latch circuit according to the present embodiment. In the diagram, (a), (b), (c), (d), and (e) respectively illustrate the input data Din, the clock signal CLK, the store enable signal /WE, the output data Qout, and the magnetization reversal current Iw.

In the normal operation, the store enable signal /WE is in an inactive state (at a high level), and the recall enable signal /RE (not illustrated) is also in the inactive state (high level). This corresponds to, for example, time t1 to t2, and t2 to t3 in FIG. 6. At this time, the clocked inverters CI2 and CI4 are constantly in ON and OFF state, respectively. Under this condition, if, for example, the clock signal CLK is at the high level, the clocked inverters CI1 and CI3 are in the ON and OFF states, respectively. In this case, the data input (Din) is directly outputted as the data output (Qout) (Through). If the clock signal CLK is at the low level, the clocked inverters CI1 and CI3 are brought into the OFF and ON states, respectively. In this case, the data input (Din) is interrupted, and states of the nodes n1 and n2, i.e., the input data (=output data) in the falling edge of the clock signal CLK is held without change (Latch). In the present latch circuit 11, an operating speed is deteriorated by increases in parasitic capacitances of the nodes n1 and n2, but the influence of the deterioration is small, and therefore the latch circuit 11 operates with having almost the same performance as that of a typical latch circuit.

In the store operation, the store enable signal /WE is brought into an active state (low level). At this time, n-channel transistors M1 and M2 of the current supply portion 12 are brought into an ON state. On the basis of this, the complementary voltages (corresponding to the data signals DW and /DW) depending on the states of the nodes n1 and n2 within the latch circuit 11 are applied to the terminals NW and /NW, and thereby the magnetization reversal current Iw is supplied to the two magnetoresistance elements 13-1 and 13-2. For example, during time t3 to t4 in FIG. 6, when the latch circuit 11 is in the holding state, the store enable signal /WE is activated (low level). At this time, the latch data (Qout) is "1", and the nodes n1 and n2 are held in the low and high level states, respectively. The current supply portion 12 respectively provides the high and low levels to the terminals NW and /NW to supply the magnetization reversal current Iw from the terminal NW toward the terminal /NW. In FIG. 5A, it is assumed that, when the magnetization reversal current Iw flows from the node n0 to the terminal NW or /NW, "0" is written to the magnetoresistance element 13-2 or 13-1, whereas when the magnetization reversal current Iw flows from the terminal NW or /NW to the node n0, "1" is written to the magnetoresistance element 13-2 or 13-1. In this case, the magnetoresistance elements 13-2 (Jt) and 13-1 (Jn) are respectively brought into the "1" and "0" states.

Similarly, for example, during time t5 to t6, when the latch circuit 11 is in the holding state, the store enable signal /WE is activated (low level). At this Lime, the latch data (Qout) is "0", and the nodes n1 and n2 are held in the high and low level states, respectively. The current supply portion 12 respectively provides the low and high levels to the terminals NW and /NW to supply the magnetization reversal current Iw from the terminal /NW toward the terminal NW. In this case, the magnetoresistance elements 13-2 (Jt) and 13-1 (Jn) are respectively brought into the "0" and "1" states.

In the present embodiment, timing at which the store enable signal /WE is activated is arbitrary. For example, during the time t4 to t5, when the latch circuit 11 is in the through state, the store enable signal /WE is activated (low level). At this time, inversion and non-inversion of the data input are directly outputted to the nodes n1 and n2, respectively, and therefore a direction of the magnetization reversal current Iw is changed depending on a value of the data input. Also, it is just conceivable that a pulse width of the magnetization reversal current Iw becomes minute, and thereby magnetization reversal of the magnetoresistance elements 13 may not be normally performed. Accordingly, the activation timing of the store enable signal /WE is preferably present during a period when the data is held (latched).

Figure 5B:
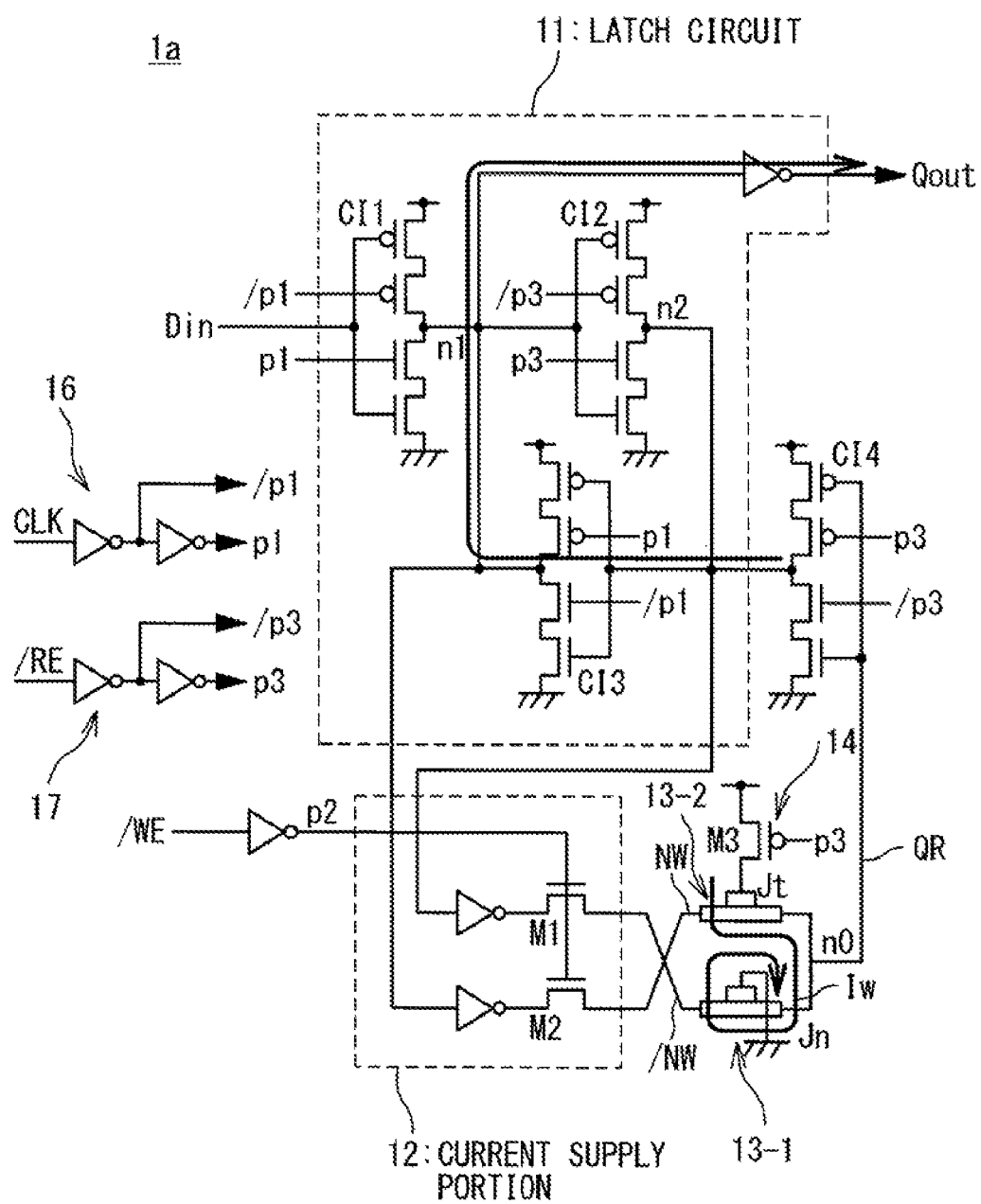
FIG. 5B is a circuit diagram illustrating a specific example of the nonvolatile latch circuit according to the first embodiment of the present invention.
Figure 7:
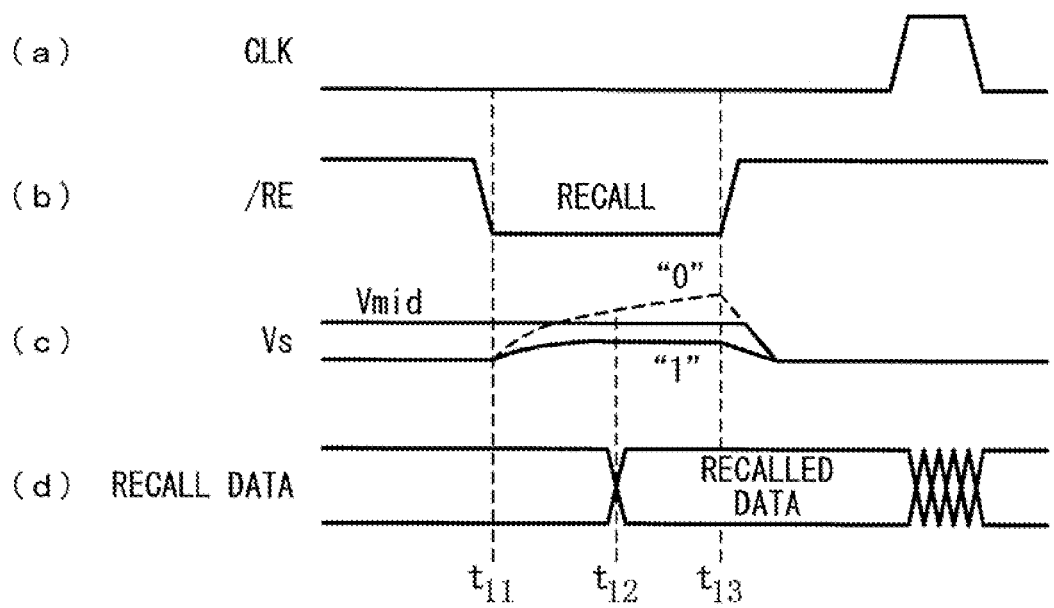
FIG. 7 is a timing chart illustrating a recall operation of the nonvolatile latch circuit according to the first embodiment of the present invention.

Next, referring to FIGS. 5B and 7, the recall operation of the nonvolatile latch circuit 1a in FIG. 5B is described. FIG. 5B is a circuit diagram illustrating a specific example of the nonvolatile latch circuit according to the present embodiment. The circuit in FIG. 5B is the same as that in FIG. 5A. However, FIG. 5B illustrates a state of the recall operation. FIG. 7 is a timing chart illustrating the recall operation of the nonvolatile latch circuit according to the present embodiment. In the diagram, (a), (b), (c), and (d) respectively illustrate the clock signal CLK, the recall enable signal /RE, the voltage Vs (output QR) at the node n0, and recall data outputted to Qout.

In the recall operation, in a state where the clock signal CLK is brought to the low level and the store enable signal /WE (not illustrated) is brought into the inactive state (high level), the recall enable signal /RE is activated (low level) (time t11). At this time, the clocked inverters CI1 and CI2 are brought into the OFF state, and the clocked inverters CI3 and CI4 are brought into the ON state. Also, the n-channel transistors M1 and M2 of the current supply portion 12 are brought into the OFF state, and the p-channel transistor M3 as the switch 14 is brought into the ON state. As a result, the tunnel current $I_T$ flows through the magnetoresistance elements 13-1 (Jn) and 13-2 (Jt). At this time, as expressed by the above expressions (1) and (2), the voltage Vs (output QR) generated at the node n0 comes to a voltage higher or lower than Vdd/2 depending on stored data stored in the magnetoresistance elements 13-1 and 13-2 (time t12). If a threshold voltage of the clocked inverter CI4 is designed to be approximately Vdd/2, the node n2 is amplified to a logical amplitude. For example, when the magnetoresistance elements 13-2 (Jt) and 13-1 (Jn) are respectively in the "0" (low resistive) and "1" (high resistive) states, the voltage Vs (output QR) at the node n0 comes to the voltage higher than the Vdd/2 (time t12). At this time, the node n2 is brought to the low level, and as recalled data, Qout="0" is outputted. On the other hand, when the magnetoresistance elements 13-2 (Jt) and 13-1 (Jn) are respectively in the "1" (high resistive) and "0" (low resistive) states, the voltage Vs (output QR) generated at the node n0 comes to the voltage lower than the Vdd/2 (time t12). At this time, the node n2 is brought to the high level, and as the recalled data, Qout="1" is outputted. Then, in a state where the clock signal CLK is kept at the low level, the recall enable signal /RE is brought into the inactive state (high level) (time t13). At this time, the clocked inverters CI1 and CI4, and CI2 and CI3 are respectively brought into the OFF and ON states, and thereby the states of the nodes n1 and n2 are held, i.e. recalled data is held. On the basis of the above, the one bit data stored in the magnetoresistance elements 13-1 and 13-2 is recalled to the latch circuit 11, and the recall operation is ended.

The recall operation described above is often performed at the time of power-on. This enables the one bit data stored in the magnetoresistance elements 13-1 and 13-2 to be transferred to the latch circuit 11 to recall a state (data) just before interruption of the power supply.

In addition, it can be thought that the latch circuit 11 is provided with a data holding circuit and a third switch portion.

Here, the data holding circuit performs positive feedback based on a first inverting circuit and a second inverting circuit. Note that the first inverting circuit includes a p-channel transistor connected to the power supply voltage and an n-channel transistor connected to the ground in the clocked inverter CI2. The second inverting circuit corresponds to the clocked inverter CI3. The third switch portion includes a p-channel transistor (input: /p3) and an n-channel transistor (input: p3) on an output (node n2) side in the clocked inverter CI2.

Also, it can be thought that the nonvolatile latch circuit includes a second switch portion and a third inverting circuit. The second switch portion is provided between the node n0 connected with the magnetoresistance elements 13-1 and 13-2 and an input terminal of the clocked inverter CI3 as the second inverting circuit. The second switch portion includes a p-channel transistor (input: p3) and a n-channel transistor (input: /p3) on an output (node n2) side in the clocked inverter CI4. The third inverting circuit is provided between the node n0 and the second switch portion, and includes a p-channel transistor connected to the power supply voltage and an n-channel transistor connected to the ground in the clocked inverter CI4.

Further, at the time of the recall operation of storage information indicating the magnetization states accumulated in the magnetoresistance elements 13-1 and 13-2, the second switch portion and third switch portion are respectively brought into ON and OFF states.

Figure 8A:
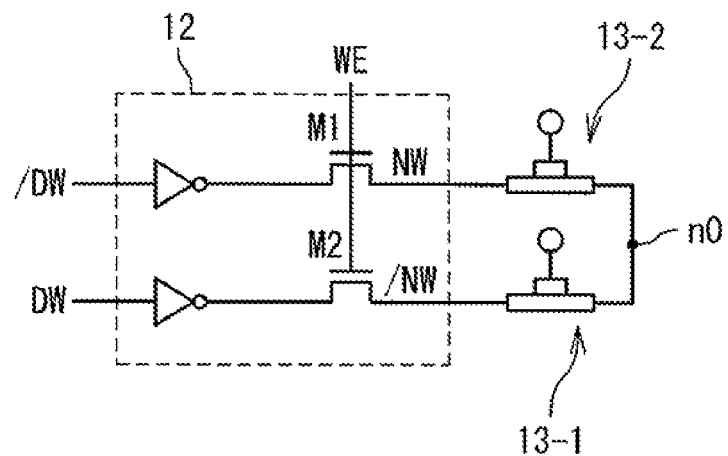
FIG. 8A is a circuit diagram illustrating a configuration example of a current supply portion used for the nonvolatile latch circuit according to the embodiment of the present invention.
Figure 8B:
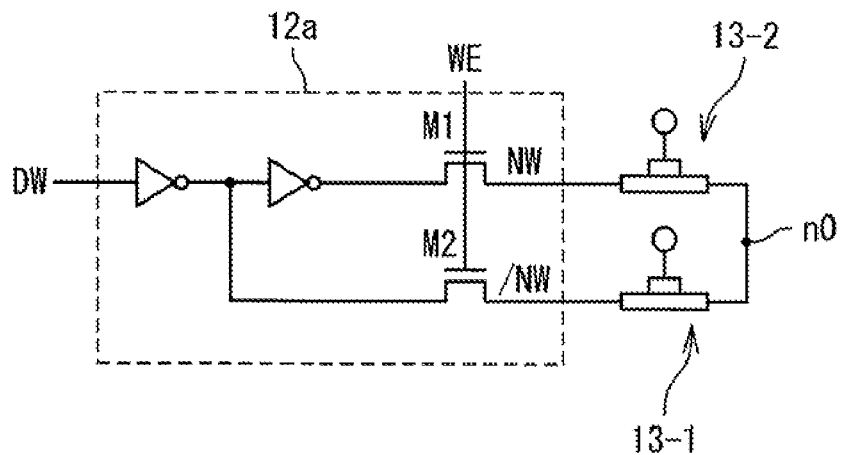
FIG. 8B is a circuit diagram illustrating another configuration example of the current supply portion used for the nonvolatile latch circuit according to the embodiment of the present invention.
Figure 8C:
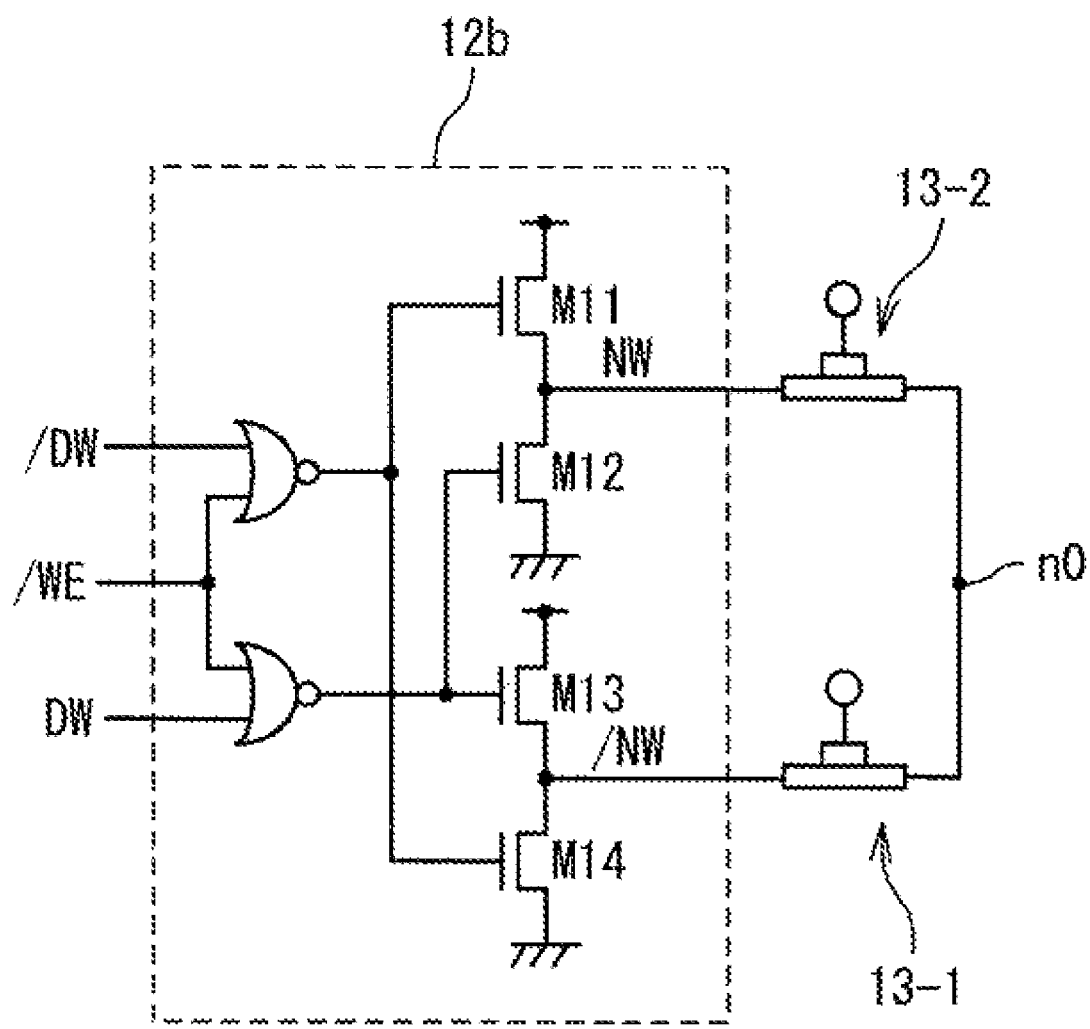
FIG. 8C is a circuit diagram illustrating still another configuration example of the current supply portion used for the nonvolatile latch circuit according to the embodiment of the present invention.

The current supply portion 12 is not limited to one illustrated in FIG. 5A or 5B in the present embodiment. FIGS. 8A to 8C are circuit diagrams illustrating configuration examples of the current supply portion used for the nonvolatile latch circuit according to the present embodiment. Note that the current supply portion 12 in FIG. 8A is the same as the current supply portion 12 illustrated in FIG. 5A or 5B, and therefore description thereof is omitted.

In a current supply portion 12a in FIG. 8B, input to the current supply portion 12a is provided through one terminal connected to the node n1 or n2. In this case, there is an advantage that, as compared with the case of the current supply portion 12, the number of wiring lines between the latch circuit 11 and the current supply portion 12a can be reduced. However, if ON resistances of n-channel transistors M1 and M2 are made too small, an input voltage of a second stage inverter is likely to take an intermediate value, and a through current of the inverter is likely to flow.

In a current supply portion 12b in FIG. 8C, when "0" data is stored (the store enable signal /WE is at the low level, the data signal (voltage at the node n1) DW is at the low level, and the data signal (voltage at the node n2) /DW is at the high level), n-channel transistors M12 and M13 are brought into an ON state, and n-channel transistors M11 and M14 are brought into an OFF state. As a result, the magnetization reversal current Iw flows in a direction from a terminal /NW to a terminal NW through the magnetoresistance elements 13-1 and 13-2. When "1" data is stored (the store enable signal /WE is at the low level, the data signal (voltage at the node n1) DW is at the high level, and the data signal (voltage at the node n2) /DW is at the low level), the n-channel transistors M11 and M14 are brought into the ON state, and the n-channel transistors M12 and M13 are brought into the OFF state. As a result, the magnetization reversal current Iw flows in a direction from the terminal NW to the terminal /NW through the magnetoresistance elements 13-2 and 13-1. When the store operation is not performed (the store enable signal /WE is at the high level, and the data signal (voltage at the node n1) DW and the data signal (voltage at the node n2) /DW are arbitrary), the n-channel transistors M1 to M4 are all brought into the OFF state, and therefore the magnetization reversal current Iw is not supplied to the magnetoresistance element 13-2 or 13-1. In the present current supply portion 12b, the n-channel transistors M11 and M12 can be decreased in size, and therefore in the case where the magnetization reversal current is as large as 1 mA or more, a circuit area may be able to be reduced as compared with the current supply portion 12 in FIG. 8A.

In the above, the first embodiment of the present invention has been described in detail; however, this is not limited to the circuit illustrated in FIG. 5A or 5B, but can be appropriately modified within the scope of the technical idea of the present invention.

Figure 9A:
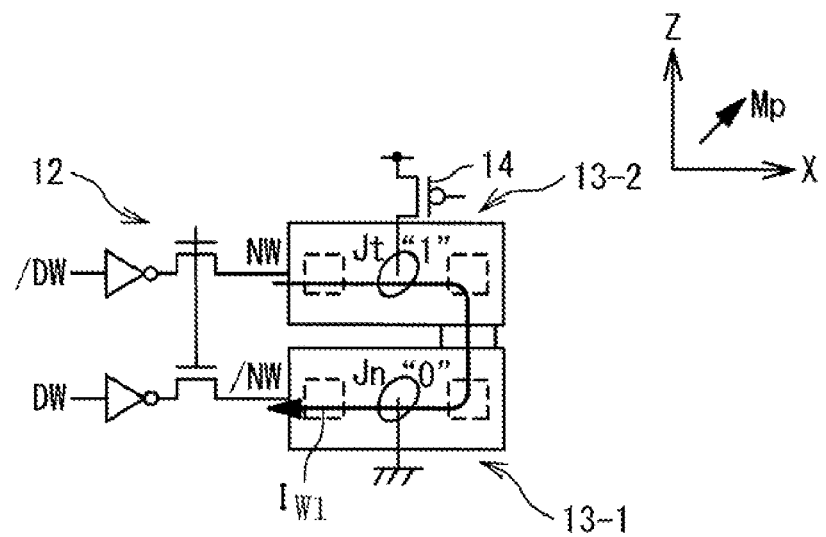
FIG. 9A is a configuration diagram illustrating an arrangement of the current supply portion and magnetoresistance elements used for the nonvolatile latch circuit according to the embodiment of the present invention.
Figure 9B:
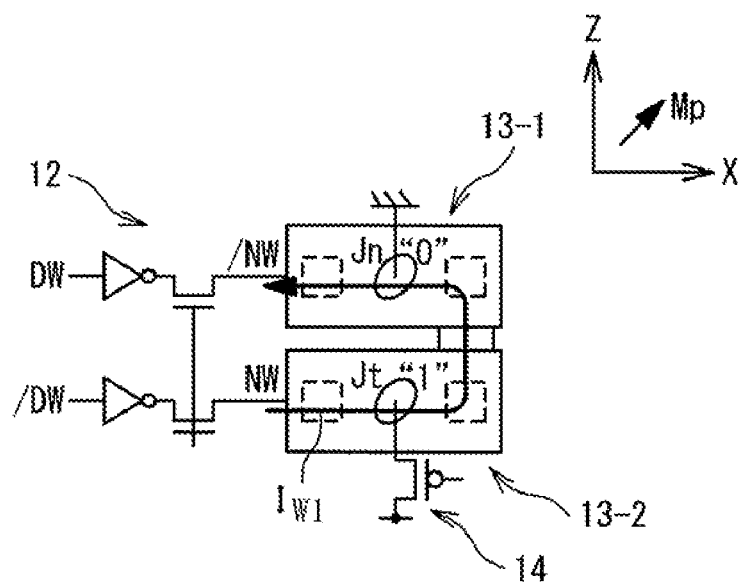
FIG. 9B is a configuration diagram illustrating another arrangement of the current supply portion and magnetoresistance elements used for the nonvolatile latch circuit according to the embodiment of the present invention.
Figure 9C:
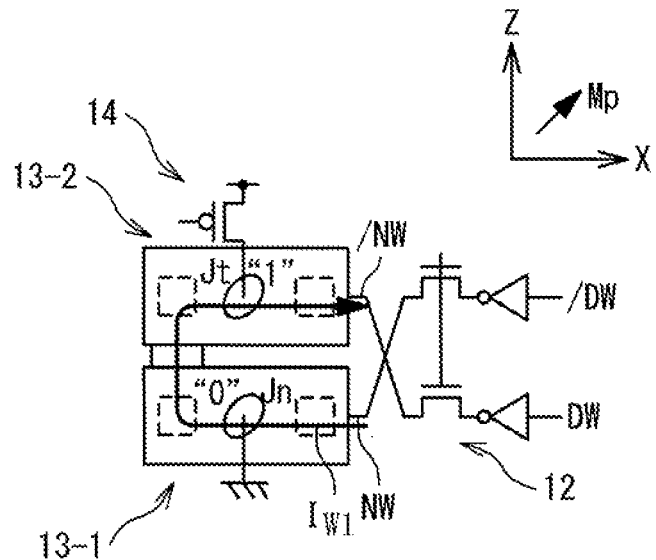
FIG. 9C is a configuration diagram illustrating still another arrangement of the current supply portion and magnetoresistance elements used for the nonvolatile latch circuit according to the embodiment of the present invention.
Figure 9D:
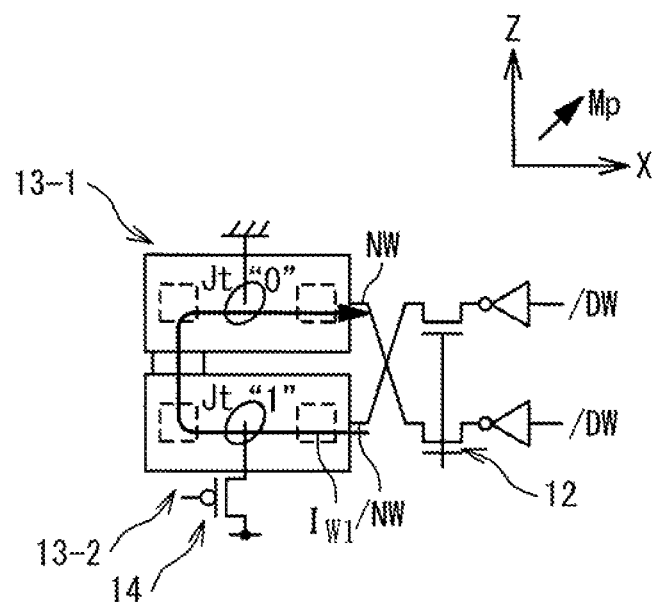
FIG. 9D is a configuration diagram illustrating yet another arrangement of the current supply portion and magnetoresistance elements used for the nonvolatile latch circuit according to the embodiment of the present invention.

For example, depending on arrangement of layout cells in the present nonvolatile latch circuit, a magnetization direction of the magnetization pinned layer, or the like, cell layout or wiring connections may be optimally modified. FIGS. 9A to 9D are configuration diagrams illustrating arrangements of the current supply portion and the magnetoresistance elements used for the nonvolatile latch circuit according to the present embodiment. FIG. 9A illustrates the same nonvolatile latch cell layout as in FIG. 1. FIG. 9B illustrates a cell layout in which the cell layout in FIG. 9A is inverted with respect to an X axis. FIG. 9C illustrates a cell layout in which the cell layout in FIG. 9A is inverted with respect to a Y axis. FIG. 9D illustrates a cell layout in which the cell layout in FIG. 9A is inverted with respect to both of the X and Y axes. Note that, in any of the cell layouts in FIGS. 9A to 9D, the layout is appropriately modified such that magnetization directions ($M_P$ and $M_F$) of the magnetoresistance elements 13-1 and 13-2 are tilted at an angle of 45 degrees from the +X direction to the +Y direction. Further, connections of the terminals NW and /NW are appropriately modified such that a flow direction of the magnetization reversal current Iw is not inverted. For example, in the cell layout in FIG. 9C or 9D, by replacing the connections of the terminals NW and /NW by each other, the flow direction of the magnetization reversal current Iw can be matched.

For example, in FIGS. 5A and 5B, the circuit may be configured such that, with making consideration such that data logic upon recall is not inverted, a switch (transistor) is connected to the upper terminal of the magnetoresistance element 13-1 (Jn); the upper terminal of the magnetoresistance element 13-2 (Jt) is grounded; an inverter of which an input terminal is connected to the node n0 is newly added; and an output of the inverter is inputted to the clocked inverter CI4.

For example, in FIGS. 5A and 5B, each of the clocked inverters CI1 to CI4 can be replaced by an inverter and a transfer gate.

For example, in FIGS. 5A and 5B, the circuit configuration is specifically exemplified with use of the high through latch as an example. However, by replacing the terminals respectively inputted with the clock signals p1 and /p1 by each other, the nonvolatile latch circuit can be made to function as a low through latch.

Further, a structure of the magnetoresistance element is not limited to any of the structures in FIGS. 2A to 2C, 3A and 3B. For example, if the magnetoresistance element has a structure that the electrically conductive layer (or wiring layer) where the magnetization reversal current flows is provided on an upper or lower surface of the tunnel junction, parallel to a planar direction of the tunnel junction, and the electrically conductive layer and one terminal of the tunnel junction are electrically connected to each other, it can be applied to the present embodiment.

According to the present invention, in the nonvolatile latch circuit using the magnetoresistance elements, a limit to the number of times for storing a state of the flip-flop circuit and the deterioration in operating speed can be substantially eliminated. Also, the recall operation can be performed with high reliability. Further, an increase in a primitive cell area, and an overhead of LSI layout design cost can be suppressed. Still further, power can be easily and quickly stopped or supplied.

Second Embodiment

Figure 10:
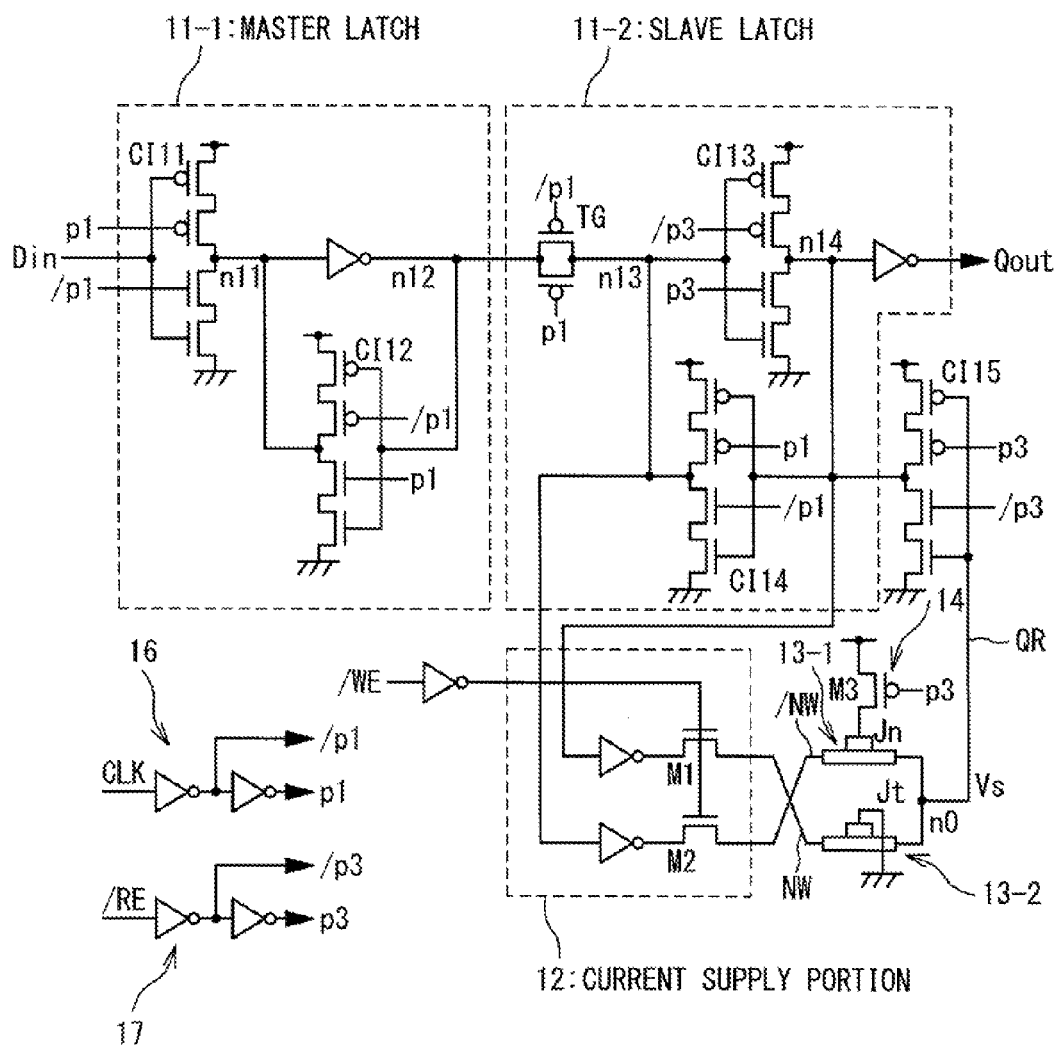
FIG. 10 is a schematic configuration diagram illustrating a configuration of a nonvolatile latch circuit according to a second embodiment of the present invention.

An example in which a nonvolatile latch circuit using a magnetoresistance element is applied to a delay flip-flop (DFF) will be described as the nonvolatile latch circuit of the present invention. FIG. 10 is a schematic configuration diagram illustrating a configuration of a nonvolatile latch circuit according to a second embodiment of the present invention. The nonvolatile latch circuit 1b uses, in the delay flip-flop of a master-slave system, as a slave latch, a circuit equivalent to the high through latch circuit (nonvolatile latch circuit 1a) illustrated in FIGS. 5A and 5B. The nonvolatile latch circuit 1b includes a master latch circuit 11-1, a slave latch circuit 11-2, a current supply portion 12, signal conversion portions 16 and 17, a clocked inverter CI15, and magnetoresistance elements 13-1 and 13-2.

The master latch circuit 11-1 includes clocked inverters CI11 and CI12. The clocked inverter CI11 is supplied with input data Din and clock signals p1 and /p1, and on the basis of them, outputs a signal to a node n11. The signal at the node n11 is inverted by an inverter, and then outputted to a node n12. The clocked inverter CI12 is supplied with the signal at the node n12 and the clock signals p1 and /p1, and on the basis of them, outputs a signal to the node n11. The node n12 is also connected to the slave latch circuit 11-2.

The slave latch circuit 11-2 includes a transfer gate TG, and clocked inverters CI13 and CI14. The transfer gate TG is supplied with the signal at the node n12 and the clock signals p1 and /p1, and on the basis of them, outputs a signal to a node n13. The clocked inverter CI13 is supplied with the signal at the node n13 and recall enable signals p3 and /p3, and on the basis of them, outputs a signal to a node n14. The clocked inverter CI14 is supplied with the signal at the node n14 and the clock signals p1 and /p1, and on the basis of them, outputs a signal to the node n13. The node n14 is also connected to a terminal outputting output data Qout and the current supply portion 12. The node n13 is also connected to the current supply portion 12. The signal at the node n13 or n14 corresponds to a data signal DW (or an inverted signal /DW).

The current supply portion 12 is, upon a write operation to the magnetoresistance elements 13-1 and 13-2, supplied with an inverted signal p2 of a store enable signal /WE and inverted signals of the signals at the nodes n13 and n14 from the slave latch circuit 11-2. Then, on the basis of them, the current supply portion 12 supplies magnetization reversal current Iw in a forward or reverse direction through a DC current path via the magnetoresistance elements 13-1 and 13-2 between terminals NW and /NW.

The signal conversion portions 16 and 17 are the same as those in the first embodiment. The clocked inverter CI15 is supplied with the recall enable signals p3 and /p3 and an output QR corresponding to a voltage Vs at a node n0. Then, on the basis of them, the clocked inverter CI15 outputs a signal to the node n14.

Note that the signal conversion portions 16 and 17 and the clocked inverter CI15 may be included in any of the master latch circuit 11-1 or the slave latch circuit 11-2. Also, the magnetoresistance elements 13-1 and 13-2 are the same as those in the first embodiment. Note that an upper terminal of the magnetoresistance element 13-1 is connected with a switch 14, and an upper terminal of the magnetoresistance element 13-2 is connected with the ground.

Figure 11:
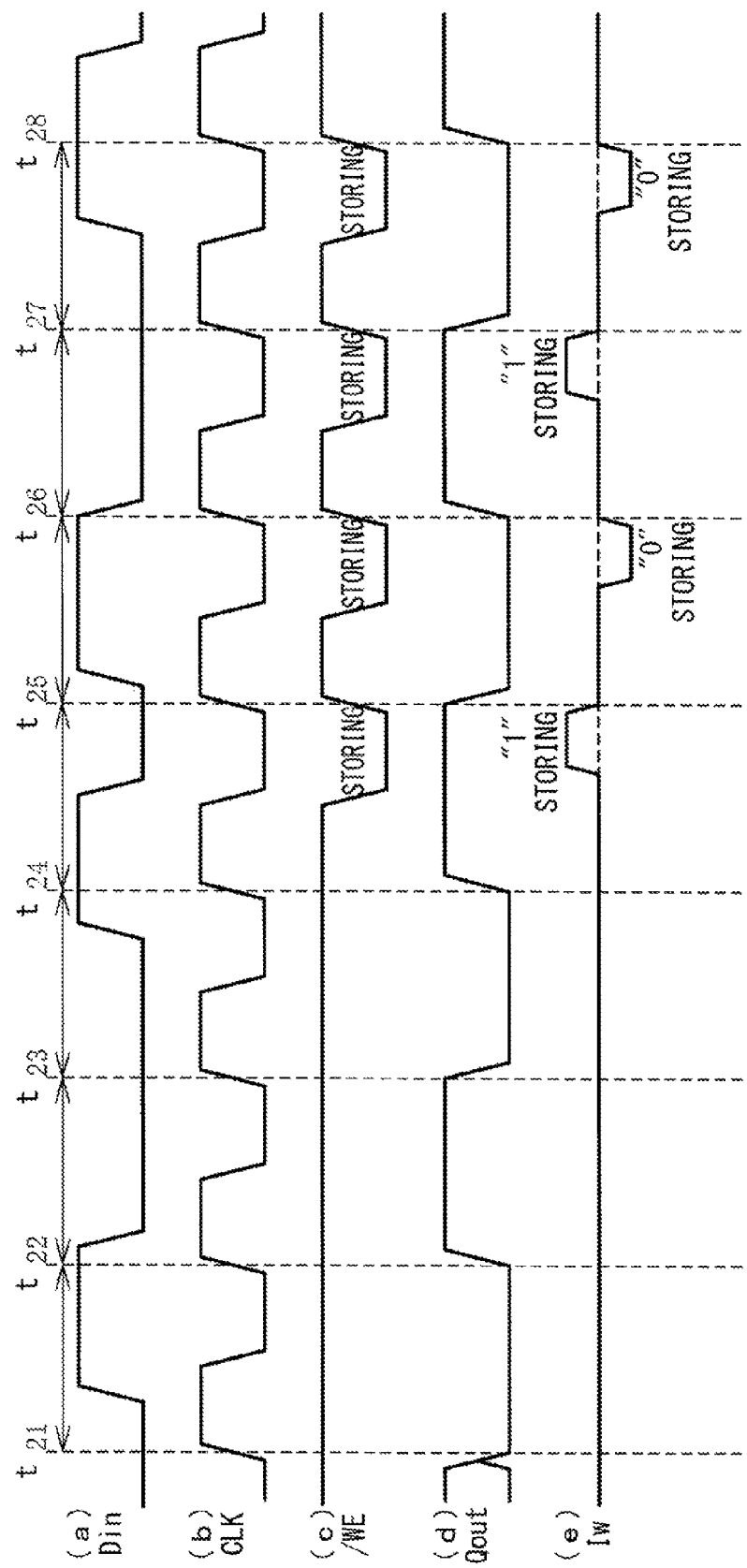
FIG. 11 is a timing chart illustrating a normal operation of the nonvolatile latch circuit according to the second embodiment of the present invention.

Next, referring to FIGS. 10 and 11, a normal operation (including a store operation) of the nonvolatile latch circuit 1b in FIG. 10 is described. FIG. 11 is a timing chart illustrating the normal operation of the nonvolatile latch circuit according to the present embodiment. In the diagram, (a), (b), (c), (d), and (e) respectively illustrate the input data Din, the clock signal CLK, the store enable signal /WE, the output data Qout, and the magnetization reversal current Iw.

In the normal operation (e.g.: t21 to t24 in FIG. 11), the store enable signal /WE is in an inactive state (high level), and the recall enable signal /RE (not illustrated) is also in the inactive state (high level). At this time, the clocked inverter CI13 operates in an ON state, the clocked inverter CI15 operates in an OFF state, and all of n-channel transistors M1 and M2 and p-channel transistor M3 as the switch 14 operate in an OFF state. That is, the operation is the same as that of a typical delay flip-flop, and therefore almost the same operating speed as that of the typical delay flip-flop can be achieved.

In the store operation (e.g.: t24 to t28 in FIG. 11), the store enable signal /WE is activated (low level), and the n-channel transistors M1 and M2 are both brought into an ON state. On the basis of this, complementary voltages (corresponding to the data signals DW and /DW) depending on states of the nodes n13 and n14 corresponding to output data (Qout) of the delay flip-flop are applied to the terminals NW and /NW, and thereby the magnetization reversal current Iw flows through the two magnetoresistance elements 13-2 (Jt) and 13-1 (Jn). For example, during time t24 to t25 and time t26 to t27 in FIG. 11, the output (Qout) of the delay flip-flop is "1", that is, the node n13 is at the high level, and the node n14 is at the low level. Accordingly, the current supply portion 12 provides the high and low levels to the terminals NW and /NW, respectively, to supply the magnetization reversal current Iw from the terminal NW toward the terminal /NW. At this time, "1" and "0" are respectively written to the magnetoresistance elements 13-2 (Jt) and 13-1 (Jn).

Similarly, for example, during the time t25 to t26, and time t27 to t28, the output (Qout) of the delay flip-flop is "0", that is, the nodes n13 and n14 are respectively at the low and high levels. Accordingly, the current supply portion 12 provides the low and high levels to the terminals NW and /NW, respectively, to supply the magnetization reversal current Iw from the terminal /NW toward the terminal NW. At this time, "0" and "1" are respectively written to the magnetoresistance elements 13-2 (Jt) and 13-1 (Jn).

In the timing chart of FIG. 11, the store enable signal /WE is in synchronization with the clock signal CLK, and activated when the clock signal CLK is at the low level. However, in the present embodiment, timing when the store enable signal /WE is activated is arbitrary. The voltages at the nodes n13 and n14 transit only at a rising edge of the clock signal CLK, and therefore if the store enable signal /WE is activated within a clock cycle, hold data can be stably stored in the magnetoresistance elements 13-1 and 13-2.

Figure 12:
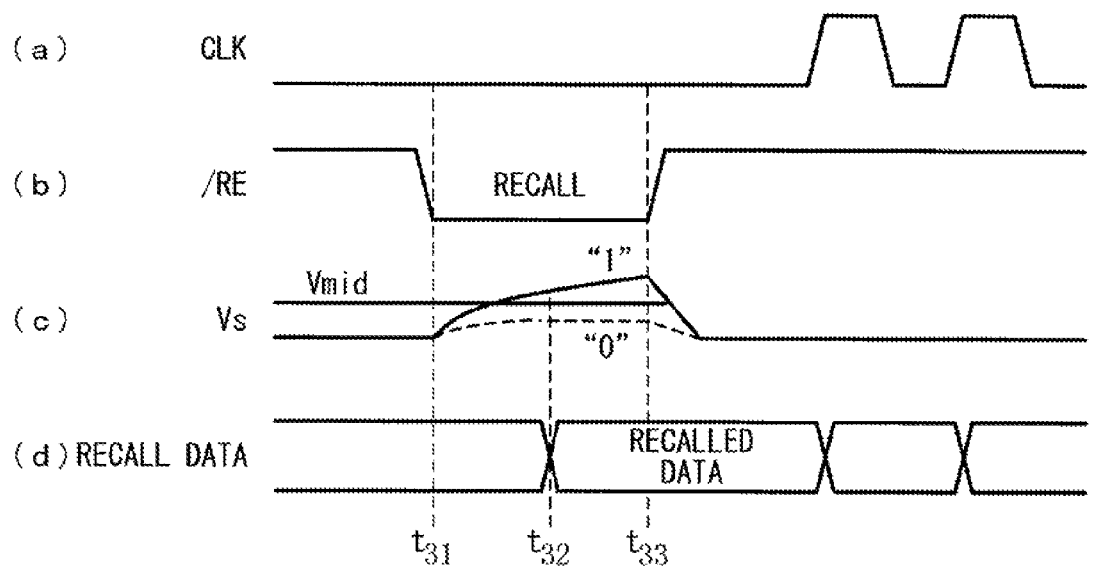
FIG. 12 is a timing chart illustrating a recall operation of the nonvolatile latch circuit according to the second embodiment of the present invention.

Next, referring to FIGS. 10 and 12, the recall operation of the nonvolatile latch circuit 1b in FIG. 10 is described. FIG. 12 is a timing chart illustrating the recall operation of the nonvolatile latch circuit according to the present embodiment. In the diagram, (a), (b), (c), and (d) respectively illustrate the clock signal CLK, the recall enable signal /RE, the voltage Vs at the node n0 (output QR), and recall data outputted to Qout.

In the recall operation, similarly to the first embodiment, in a state where the clock signal CLK is brought to the low level, and the store enable signal /WE (not illustrated) is brought into the inactive state (high level), the recall enable signal /RE is activated (low level) (time t31). At this time, in the slave latch circuit 11-2, the transfer gate TG and the clocked inverter CI13 are brought into the OFF state, and the clocked inverters CI14 and CI5 are brought into the ON state. Also, the n-channel transistors M1 and M2 of the current supply portion 12 are brought into the OFF state, and the p-channel transistor M3 as the switch 14 is brought into the ON state. As a result, the tunnel current $I_T$ flows through the magnetoresistance elements 13-1 (Jn) and 13-2 (Jt). At this time, as expressed by the above expression (1) or (2), the voltage Vs (output QR) generated at the node n0 comes to a voltage higher or lower than Vdd/2 depending on pieces of stored data stored in the magnetoresistance elements 13-1 and 13-2. For example, when the magnetoresistance elements 13-2 (Jt) and 13-1 (Jn) are respectively in the "0" (low resistive) and "1" (high resistive) states, the voltage Vs (output QR) at the node n0 comes to the voltage lower than the Vdd/2 (time t32). At this time, the node n14 is brought to the high level, and as recalled data, Qout of "0" is outputted as the output of the delay flip-flop. On the other hand, when the magnetoresistance elements 13-2 (Jt) and 13-1 (Jn) are respectively in the "1" (high resistive) and "0" (low resistive) states, the voltage Vs (output QR) at the node n0 comes to the voltage higher than the Vdd/2 (time t32). At this time, the node n14 is brought to the low level, and as the recalled data, Qout of "1" is outputted as the output of the delay flip-flop. Then, in a state where the clock signal CLK is kept at the low level, the recall enable signal /RE is brought into the inactive state (high level) (time t33). At this time, the clocked inverter CI13 is brought into the ON state, and the clocked inverter CI14 and the p-channel transistor M3 as the switch 14 are brought into the OFF state. That is, this state corresponds to a state where, in the normal operation, the output (QR) of the delay flip-flop is held in the slave latch circuit 11-2. On the basis of the above, the one bit data stored in the magnetoresistance elements 13-1 and 13-2 is recalled to the delay flip-flop, and the recall operation is terminated.

The recall operation described above is often performed at the time of power-on. This enables the one bit data stored in the magnetoresistance elements 13-1 and 13-2 to be transferred to the delay flip-flop to recall a state (data) just before interruption of the power supply.

In the above, the second embodiment of the present invention has been described in detail; however, the nonvolatile latch circuit 1b is not limited to the circuit illustrated in FIG. 10, but can be appropriately modified within the scope of the technical idea of the present invention. For example, by applying the nonvolatile low through latch based on the first embodiment as the master latch circuit, a nonvolatile delay flip-flop circuit can also be configured.

According to the present invention, in the nonvolatile latch circuit using the magnetoresistance elements, a limit to the number of times for storing a state of the flip-flop circuit and the deterioration in operating speed can be practically eliminated. Also, the recall operation can be performed with high reliability. Further, an increase in primitive cell area, and an overhead of LSI layout design cost can be suppressed. Still further, power can be easily and quickly stopped or supplied.

Third Embodiment

Figure 13:
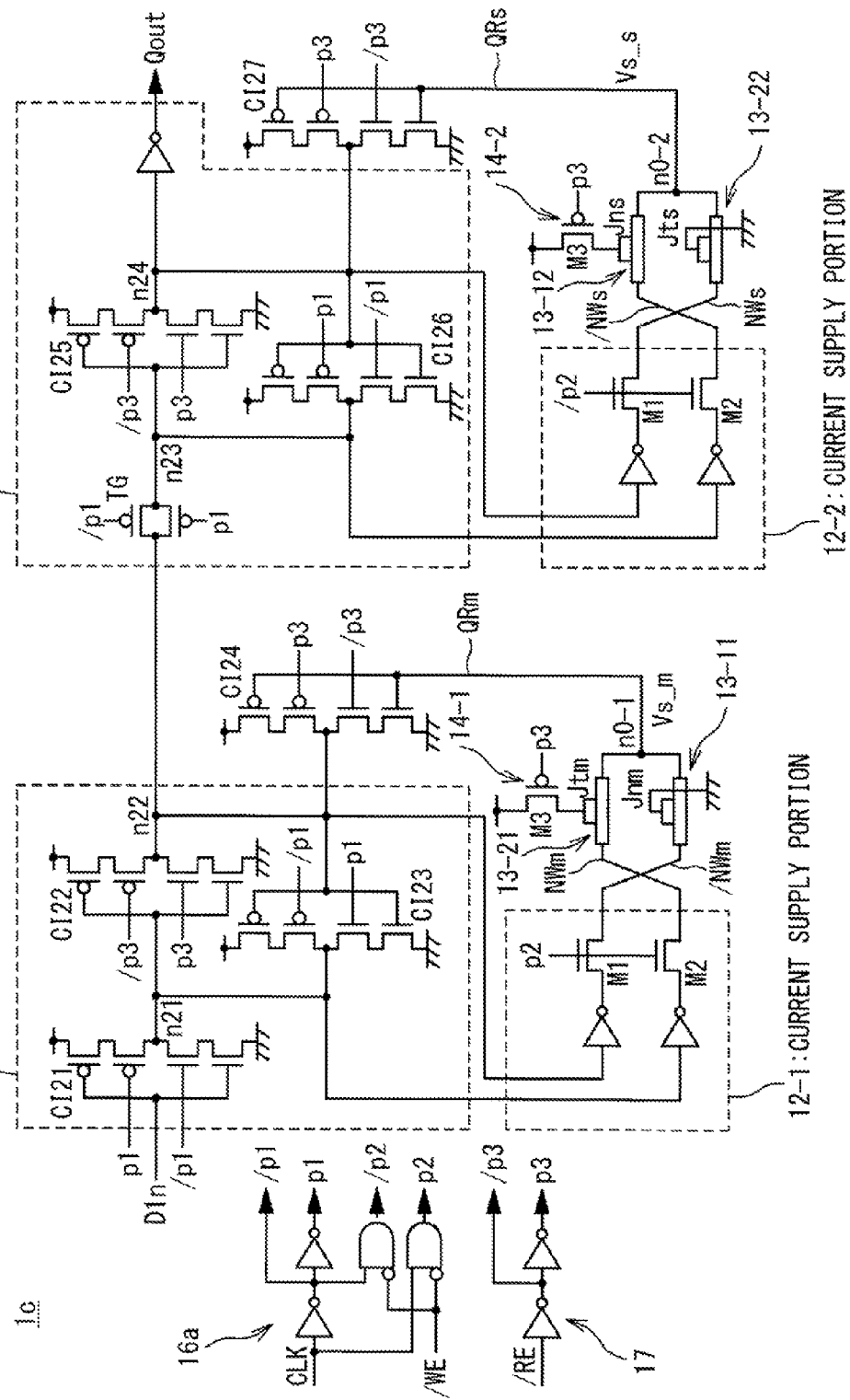
FIG. 13 is a schematic configuration diagram illustrating a configuration of a nonvolatile latch circuit according to a third embodiment of the present invention.

Another example in which a nonvolatile latch circuit using a magnetoresistance element is applied to a delay flip-flop (DFF) will be described as the nonvolatile latch circuit of the present invention. FIG. 13 is a schematic configuration diagram illustrating a configuration of a nonvolatile latch circuit according to a third embodiment of the present invention. The nonvolatile latch circuit 1c uses, in the delay flip-flop of a master-slave system, the non-volatile low through latch circuit using the magnetoresistance elements based on the first embodiment as a master latch circuit, and the non-volatile high through latch circuit using the magnetoresistance elements based on the first embodiment as a slave latch circuit. The nonvolatile latch circuit 1c is provided with a master latch circuit 11-1a, a clocked inverter CI24, a current supply portion 12-1, magnetoresistance elements 13-11 and 13-21, a slave latch circuit 11-2a, a clocked inverter CI27, a current supply portion 12-2, magnetoresistance elements 13-12 and 13-22, and signal conversion portions 16a and 17.

The master latch circuit 11-1a includes clocked inverters CI21, CI22, and CI23. The clocked inverter CI21 is supplied with input data Din and clock signals p1 and /p1, and on the basis of them, outputs a signal to a node n21. The clocked inverter CI22 is supplied with the signal at the node 21 and recall enable signals p3 and /p3, and on the basis of them, outputs a signal to a node n22. The clocked inverter CI23 is supplied with the signal at the node n22 and the clock signals p1 and /p1, and on the basis of them, outputs a signal to the node n21. The node n22 is also connected to the slave latch circuit 11-2a and current supply portion 12-1. The node 21 is also connected to the current supply portion 12-1. The signal at the node n21 or n22 corresponds to a data signal DW (or an inverted signal /DW of the data signal DW) of the master latch circuit 11-1a.

The current supply portion 12-1 is, upon a write operation to the magnetoresistance elements 13-11 and 13-21, supplied with an inverted signal p2 of a store enable signal /WE synchronized with a clock signal CLK, and inverted signals of the signals at the node n21 and n22 from the master latch circuit 11-1a. Then, on the basis of them, the current supply portion 12-1 supplies magnetization reversal current Iw in a forward or reverse direction through a DC current path via the magnetoresistance elements 13-21 and 13-11 between terminals NWm and /NWm.

The magnetoresistance elements 13-11 and 13-21 are the same as those in the first embodiment. Note that an upper terminal of the magnetoresistance element 13-21 is connected with a switch 14-1 (e.g.: p-channel transistor), and an upper terminal of the magnetoresistance element 13-11 is connected to the ground.

The clocked inverter CI24 is supplied with the recall enable signals p3 and /p3, and an output QRm corresponding to a voltage Vs_m at a node n0-1 between the magnetoresistance elements 13-11 and 13-21. On the basis of them, the clocked inverter CI24 outputs a signal to the node n22.

The slave latch circuit 11-2a includes a transfer gate TG, and clocked inverters CI25 and CI26. The transfer gate TG is supplied with the signal at the node n22 and the clocked signals p1 and /p1, and on the basis of them, outputs a signal to a node n23. The clocked inverter CI25 is supplied with the signal at the node n23 and the recall enable signals p3 and /p3, and on the basis of them, outputs a signal to a node n24. The clocked inverter CI26 is supplied with the signal at the node n24 and the clock signal p1 and /p1, and on the basis of them, outputs a signal to the node n23. The node n24 is also connected to a terminal outputting an output data Qout and the current supply portion 12-2. The node n23 is also connected to the current supply portion 12-2. The signal at the node n23 or n24 corresponds to a data signal DW (or an inverted signal /DW of the data signal DW) of the slave latch circuit 11-2a.

The current supply portion 12-2 is, upon a write operation to the magnetoresistance elements 13-12 and 13-22, supplied with an inverted signal /p2 of the inverted signal p2 of the store enable signal /WE synchronized with the clock signal CLK, and inverted signals of the signals at the node n23 and n24 from the slave latch circuit 11-2a. Then, on the basis of them, the current supply portion 12-2 supplies magnetization reversal current Iw in a forward or reverse direction through a DC current path via the magnetoresistance elements 13-22 and 13-12 between terminals NWs and /NWs.

The magnetoresistance elements 13-12 and 13-22 are the same as those in the first embodiment. Note that an upper terminal of the magnetoresistance element 13-12 is connected with a switch 14-2 (e.g.: p-channel transistor), and an upper terminal of the magnetoresistance element 13-22 is connected to the ground.

The clocked inverter CI27 is supplied with the recall enable signals p3 and /p3, and an output QRs corresponding to a voltage Vs_s at a node n0-2 between the magnetoresistance elements 13-12 and 13-22. On the basis of them, the clocked inverter CI27 outputs a signal to the node n24.

The signal conversion portion 16a converts the clock signal CLK to the clock signals /p1 and p1 respectively obtained by inverting the clock signals CLK and /p1, and then outputs them. In addition, the signal conversion portion 16a converts the store enable signal /WE to the inverted signals p2 and /p2 respectively obtained by inverting the store enable signal /WE synchronized with the clock signal CLK and the inverted signal p2 of the store enable signal /WE synchronized with the clock signal CLK, and then outputs them. The signal conversion portion 17 is the same as that in the first embodiment.

Note that the signal conversion portions 16a and 17 and clocked inverter CI24 may be included in the master latch circuit 11-1a. The clocked inverter CI27 may be included in the slave latch circuit 11-2a.

Next, referring to FIGS. 13 and 14, a normal operation (including a store operation) of the nonvolatile latch circuit 1c in FIG. 13 is described. FIG. 14 is a timing chart illustrating the normal operation of the nonvolatile latch circuit according to the present embodiment. In the diagram, (a), (b), (c), (d), (e), (f), and (g) respectively illustrate the input data Din, the clock signal CLK, the store enable signal /WE, node n22 of the master latch circuit 11-1a, output data Qout of the slave latch circuit 11-2a, magnetization reversal current Iwm on a master latch circuit 11-1a side, and magnetization reversal current Iws on a slave latch circuit 11-2a side.

In the normal operation (e.g.: t41 to t44 in FIG. 14), the store enable signal /WE is in an inactive state (high level), and the recall enable signal /RE (not illustrated) is also in the inactive state (high level). At this time, the clocked inverters CI22 and CI25 operate in an ON state, the clocked inverters CI24 and CI27 operate in an OFF state, and all of n-channel transistors M1, M2, M4, and M5 and p-channel transistors M3 and M6 as the switches 14-1 and 14-2 operate in an OFF state. That is, the operation is the same as that of a typical delay flip-flop, and therefore almost the same operating speed as that of the typical delay flip-flop can be achieved.

In the store operation (e.g.: t44 to t48 in FIG. 14), when the store enable signal /WE is activated (low level), the store operation is started. In the present embodiment, in the store operation, during a time period when the clock signal CLK is at a high level, hold data of the master latch circuit 11-1a is stored in the magnetoresistance elements 13-21 (Jtm) and 13-11 (Jnm), whereas during a time period when the clock signal CLK is at a low level, hold data of the slave latch circuit 11-2a is stored in the magnetoresistance elements 13-22 (Jts) and 13-12 (Jns). Specifically, the store operation is as follows.

On the master latch circuit 11-1a side, when the clock signal CLK is brought to the high level, the store enable signal p2 is brought to the high level, and the n-channel transistors M1 and M2 are brought into the ON state. On the basis of this, in the master latch circuit 11-1a, complementary voltages depending on states of the nodes n21 and n22 corresponding to the hold data of the master latch circuit 11-1a are applied to the terminals NWm and /NWm, and thereby the magnetization reversal current Iwm flows through the two magnetoresistance elements 13-21 (Jtm) and 13-11 (Jnm).

For example, during time t44 to t45 and time t46 to t47 in FIG. 14, the hold data (node n22) of the master latch circuit 11-1a is "1", that is, the node n21 is at the low level, and the node n22 is at the high level. Accordingly, the current supply portion 12-1 provides the high and low levels to the terminals NWm and /NWm, respectively, to supply the magnetization reversal current Iwm from the terminal NWm toward the terminal /NWm. At this time, "1" and "0" are respectively written to the magnetoresistance elements 13-21 (Jtm) and 13-11 (Jnm).

Similarly, for example, during the time t45 to t46, and time t47 to t48 in FIG. 14, the hold data (node 22) of the master, latch circuit 11-1a is "0", that is, the node n21 is at the high level, and the node n22 is at the low level. Accordingly, the current supply portion 12-1 provides the low and high levels to the terminals NWm and /NWm, respectively, to supply the magnetization reversal current Iwm from the terminal /NWm toward the terminal NWm. At this time, "0" and "1" are respectively written to the magnetoresistance elements 13-21 (Jtm) and 13-11 (Jnm).

On the slave latch circuit 11-2a side, when the clock signal CLK is brought to the low level, the store enable signal /p2 is brought to the high level, and the n-channel transistors M4 and M5 are brought into the ON state. On the basis of this, in the slave latch circuit 11-2a, complementary voltages depending on states of the nodes n23 and n24 corresponding to the hold data (output data Qout) of the slave latch circuit 11-2a are applied to the terminals NWs and /NWs, and thereby the magnetization reversal current Iws flows through the two magnetoresistance elements 13-22 (Jts) and 13-12 (Jns).

For example, during the time t44 to t45 and the time t46 to t47 in FIG. 14, the hold data (node n24) of the slave latch circuit 11-2a is "0" (output data Qout="1"), that is, the node n23 is at the high level, and the node n24 is at the low level. Accordingly, the current supply portion 12-2 provides the high and low levels to the terminals NWs and /NWs, respectively, to supply the magnetization reversal current Iws from the terminal NWs toward the terminal /NWs. At this time, "1" and "0" are respectively written to the magnetoresistance elements 13-22 (Jts) and 13-12 (Jns).

Similarly, for example, curing the time t45 to t46, and the time t47 to t48 in FIG. 14, the hold data (node 24) of the slave latch circuit 11-2a is "1" (output data Qout="0"), that is, the node n23 is at the low level, and the node n24 is at the high level. Accordingly, the current supply portion 12-2 provides the low and high levels to the terminals NWs and /NWs, respectively, to supply the magnetization reversal current Iws from the terminal /NWs toward the terminal NWs. At this time, "0" and "1" are respectively written to the magnetoresistance elements 13-22 (Jts) and 13-12 (Jns).

In the present embodiment, the pieces of hold data of the master and slave latch circuits 11-1a and 11-2a can be alternately transferred to the magnetoresistance elements in synchronization with a phase of the clock signal CLK. For this reason, there is an advantage that, even if an instantaneous power failure occurs at any timing, at least one of the pieces of hold data can be stored in the magnetoresistance elements in a normal state. For example, in the case where the instantaneous power failure occurs when the clock signal CLK is at the high level, the magnetoresistance elements 13-21 and 13-11 on the master latch circuit 11-1a side is in the process of writing, whereas the magnetoresistance elements 13-22 and 13-12 on the slave latch circuit 11-2a side have already completed writing. That is, in the magnetoresistance elements 13-22 and 13-12 on the slave latch circuit 11-2a side, the normal writing has been performed. For this reason, at the time of next power-on, by recalling pieces of stored data of the magnetoresistance elements 13-22 and 13-12 on the slave latch circuit 11-2a side, the present state can be restored to the normal state. Similarly, in the case where the instantaneous power failure occurs when the clock signal CLK is at the low level, the magnetoresistance elements 13-22 and 13-12 on the slave latch circuit 11-2a side is in the process of writing, whereas the magnetoresistance elements 13-21 and 13-11 on the master latch circuit 11-1a side have already completed writing That is, in the magnetoresistance elements 13-21 and 13-11 on the master latch circuit 11-1a side, the normal writing has been performed. For this reason, at the time of next power-on, by recalling pieces of stored data of the magnetoresistance elements 13-21 and 13-11 on the master latch circuit 11-1a side, the present state can be restored to the normal state. In the second embodiment, only on the slave latch circuit side (or master latch circuit side), the nonvolatile latch circuit is configured. For this reason, if the instantaneous power failure occurs in the process of writing to the magnetoresistance elements, the normal state may not be able to be recalled. However, the present embodiment ensures that, independently of timing of the instantaneous power failure, the normal state can be recalled.

Figure 15A:
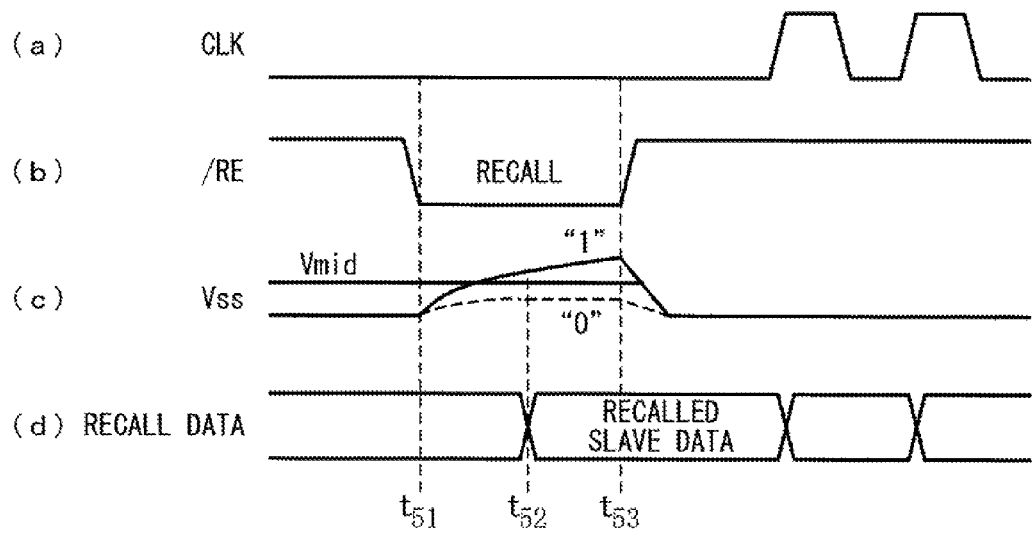
FIG. 15A is a timing chart illustrating a recall operation on a slave latch circuit side of the nonvolatile latch circuit according to the third embodiment of the present invention.
Figure 15B:
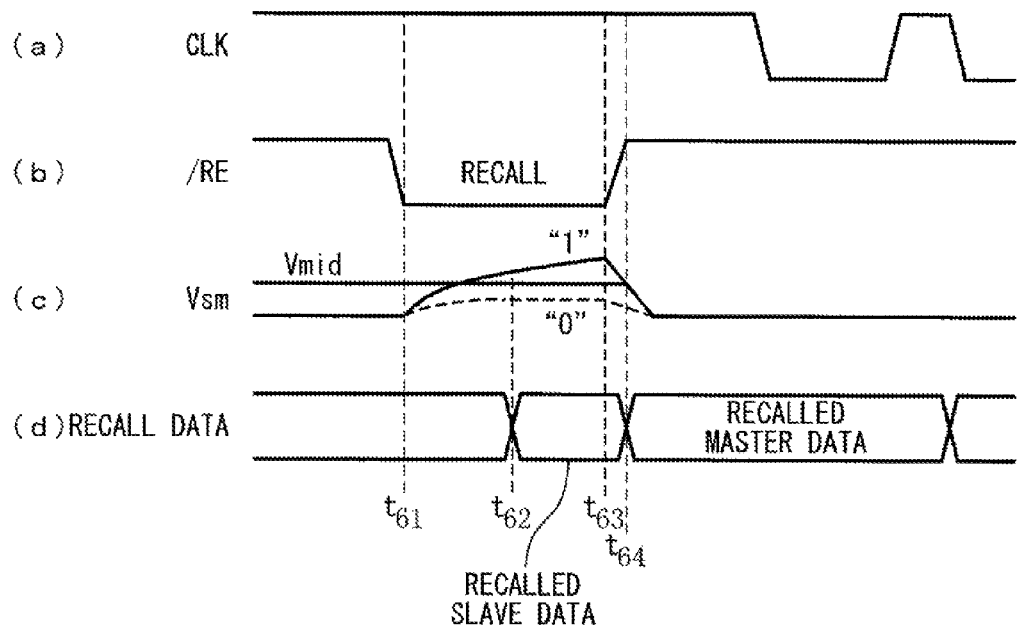
FIG. 15B is a timing chart illustrating a recall operation on a master latch circuit side of the nonvolatile latch circuit according to the third embodiment of the present invention.

Next, referring to FIGS. 13, 15A, and 15B, recall operation of the nonvolatile latch circuit 1c in FIG. 13 is described. FIG. 15A is a timing chart illustrating a recall operation on the slave latch circuit side of the nonvolatile latch circuit according to the present embodiment. In the diagram, (a), (b), (c), and (d) respectively illustrate the clock signal CLK, the recall enable signal /RE, the voltage Vss (output QRs) at the node n0-2 between the magnetoresistance elements 13-22 and 13-12, and slave side recall data outputted to Qout. Also, FIG. 15B is a timing chart illustrating a recall operation on the master latch circuit side of the nonvolatile latch circuit according to the present embodiment. In the diagram, (a), (b), (c), and (d) respectively illustrate the clock signal CLK, the recall enable signal /RE, the voltage Vsm (output QRm) at the node n0-1 between the magnetoresistance elements 13-21 and 13-11, and the master side recall data outputted to Qout. In the present embodiment, the recall operation of slave data on the slave latch circuit side is different in manner from that of master data on the master latch circuit side.

As illustrated in FIG. 15A, in the recall operation of the slave data, in a state where the clock signal CLK is brought to the low level and the store enable signal /WE (not illustrated) is brought into the inactive state (high level), the recall enable signal /RE is activated (low level) (time t51). At this time, the clocked inverters CI21, CI24, CI26, and CI27 are in the ON state, and the clocked inverters CI22, CI23, and CI25 and transfer gate TG are in the OFF state. Also, the p-channel transistors M3 and M6 as the switches 14-1 and 14-2 are brought into the ON state, and thereby tunnel currents $I_{T1}$ and $I_{T2}$ respectively flow through the both current path of the magnetoresistance elements 13-21 and 13-11 (Jtm and Jnm) on the master latch circuit 11-1a side and the magnetoresistance elements 13-22 and 13-12 (Jts and Jbs) on the slave latch circuit 11-2a side. The voltage Vs_m (output QRm) depending on the master data stored in the magnetoresistance elements 13-21 and 13-11 (Jtm and Jnm) is outputted to the node n0-1, and then transmitted to the node n22. The voltage Vs_s (output QRs) depending on the slave data stored in the magnetoresistance elements 13-22 and 13-12 (Jts and Jns) is outputted to the node n0-2, and then transmitted as the output data (Qout) of the delay flip-flop through the node n24 (time t52). Then, when the recall enable signal /RE is brought into the inactive state (high level), the clocked inverters CI22 and CI25 are brought into the ON state, and the clocked inverters CI24 and CI27 are brought into the OFF state (time t53). The master data transmitted to the node n22 is discarded, and updated to data corresponding to the data input Din. On the other hand, the slave data transmitted to the node n24 by the CI25 and CI26 that are in the ON state is latched. In this manner, the slave data stored in the magnetoresistance elements 13-22 and 13-12 (Jts and Jns) can be recalled.

As illustrated in FIG. 15B, in the recall operation of the master data, in a state where the clock signal CLK is brought to the high level, and the store enable signal /WE (not illustrated) is brought into the inactive state (high level), the recall enable signal /RE is activated (low level) (time t61). At this time, the clocked inverters CI23, CI24, and CI27 and transfer gate TG are in the ON state, and the clocked inverters CI21, CI22, CI25, and CI26 are in the OFF state. Also, the p-channel transistors M3 and M6 as the switches 14-1 and 14-2 are brought into the ON state, and thereby the tunnel currents $I_{T1}$ and $I_{T2}$ respectively flow through the both current path of the magnetoresistance elements 13-21 and 13-11 (Jtm and Jnm) on the master latch circuit 11-1a side and the magnetoresistance elements 13-22 and 13-12 (Jts and Jns) on the slave latch circuit 11-2a side. The voltage Vs_m (output QRm) depending on the master data stored in the magnetoresistance elements 13-21 and 13-11 (Jtm and Jnm) is outputted to the node n0-1, and then transmitted to the node n23 through the transfer gate TG (time t62). The voltage Vs_s (output QRs) depending on the slave data stored in the magnetoresistance elements 13-22 and 13-12 (Jts and Jns) is outputted to the node n0-2, then transmitted to the node n24, and temporarily transmitted to the output (Qout) of the delay flip-flop. Then, when the recall enable signal /RE is brought into the inactive state (high level), the clocked inverters CI22 and CI25 are brought into the ON state, and the clocked inverters CI24 and CI27 are brought into the OFF state (time t63). At this time, the master data transmitted to the node n23 is transmitted to the node n24, and the slave data is discarded. That is, as the output data (Qout) of the delay flip-flop, the master data is outputted. Further, when the clock signal CLK is brought to the low level, the clocked inverter CI26 is brought into the ON state, and the recalled master data is held by the slave latch (time t64). In this manner, the master data stored in the magnetoresistance elements 13-21 and 13-11 (Jtm and Jnm) can be recalled.

In the present embodiment, by using a circuit that detects a phase of the clock and stores information on the phase in nonvolatile memory elements such as the magnetoresistance elements, it can be determined whether the master data or slave data should be recalled. For example, by directly connecting the clock signal to the terminal DW of the current supply portion exemplified in FIG. 8A to 8C to constantly perform the write operation to the magnetoresistance elements, a phase of the clock at the time of an instantaneous power failure can be extracted.

In the nonvolatile latch circuit according to the embodiment of the present invention, the two magnetoresistance elements are connected in series between the power supply and a ground line, and the connecting terminals of the magnetoresistance elements are connected to the latch circuit. Also, the electrically conductive layer through which the magnetization reversal current flows is electrically connected to a magnetic layer, and incorporated in the magnetoresistance element. On the other hand, according to the nonvolatile latch circuit using magnetoresistance elements (MTJ element) disclosed in Japanese Translation of PCT No. 2002-511631 (corresponding to European Patent Publication No. EP1,072,040A1), Japanese Patent Publication No. JP2003-157671A, or Japanese Patent Publication No. JP2004-206835A (corresponding to US Patent Publication No. US2004125660A1), the two magnetoresistance elements (MTJ elements) are connected in parallel, and one terminal of each of the magnetoresistance elements (MTJ elements) is connected to the latch circuit. Also, referring to FIGS. 2 and 7 of Japanese Translation of PCT No. 2002-511631 (corresponding to European Patent Publication EP1,072,040A1), or FIGS. 1 and 2, of Japanese Patent Publication No. JP2003-157671A, a wiring layer through which magnetoresistance reversal current flows is physically and electrically isolated from the magnetoresistance element (MTJ element). Accordingly, it is obvious that any of the nonvolatile latch circuits described in such Patent literatures is not similar to or easy to reach the present invention.

As described above, according to the nonvolatile latch circuit of the present invention, even in the case where a signal variation of the magnetoresistance element (MTJ element) is not so large, the recall operation can be performed with high reliability. Also, an area overhead of a logic circuit associated with the addition of nonvolatility can be minimized; high-speed operation can be performed; and a single power supply can be used for primitive cells; so that a design can be made with an automatic layout tool. Further, even if a power supply of a non-operating circuit is interrupted, a state after the power supply interruption can be quickly restored to a state just before the power supply interruption. The nonvolatile latch circuit of the present invention can be used in a large number of logic circuits included in a large-scale integrated circuit (LSI) as a latch circuit. In addition, a high-performance and low power consumption LSI can be realized.

According to the present invention, in a nonvolatile latch circuit using a magnetoresistance element, and a logic circuit using the nonvolatile latch circuit, even after the stop or interruption of power supply, a state of a latch circuit or a flip-flop circuit can be efficiently held with high reliability.

Each configuration, operation, and technique used in each of the above embodiments can be applied to the other embodiment unless a technical contradiction occurs.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

The invention claimed is:

1. A nonvolatile latch circuit comprising:
a latch circuit configured to temporarily hold data;
a first magnetoresistance element and a second magnetoresistance element, each configured to include a first magnetic layer and a second magnetic layer that are stacked with an insulating film sandwiched therebetween; and
a current supply portion configured to complementarily changes magnetization states of said first magnetoresistance element and said second magnetoresistance element based on a state of said latch circuit,
wherein said first magnetic layer of said first magnetoresistance element and said first magnetic layer of said second magnetoresistance element are series-connected to each other in,
wherein said latch circuit has a function that brings data corresponding to said magnetization states to data held by said latch circuit, and
wherein a terminal on said second magnetic layer of said first magnetoresistance element is grounded and a terminal on said second magnetic layer of said second magnetoresistance element is connected to a power supply line through a switch portion.

2. The nonvolatile latch circuit according to claim 1, wherein said current supply portion supplies a magnetization reversal current to said first magnetoresistance element and said second magnetoresistance element such that said magnetization reversal current flows through said series-connection in a direction corresponding to a state of said latch circuit.

3. The nonvolatile latch circuit according to claim 1, wherein said latch circuit brings data corresponding to a voltage generated at a connection portion between said first magnetoresistance element and said second magnetoresistance element to data held by said latch circuit, when said magnetization reversal current flows from said power supply line to said ground through said first magnetoresistance element and said second magnetoresistance element.

4. A nonvolatile latch circuit comprising:
a latch circuit configured to temporarily hold data;
a first magnetoresistance element and a second magnetoresistance element, each configured to include a first magnetic layer and a second magnetic layer that are stacked with an insulating film sandwiched therebetween; and
a current supply portion configured to complementarily changes magnetization states of said first magnetoresistance element and said second magnetoresistance element based on a state of said latch circuit, wherein said first magnetic layer of said first magnetoresistance element and said first magnetic layer of said second magnetoresistance element are series-connected to each other in, wherein said latch circuit has a function that brings data corresponding to said magnetization states to data held by said latch circuit, and wherein each of said first magnetoresistance element and said second magnetoresistance element includes:

a first terminal and a second terminal configured to be provided at both ends of said first magnetic layer, and a third terminal configured to be provided at an upper portion of said second magnetic layer, wherein said second terminal of said first magnetoresistance element and said second terminal of said second magnetoresistance element is connected to each other, wherein said third terminal of said first magnetoresistance element is grounded, and wherein said third terminal of said second magnetoresistance element is connected to a power supply line through a first switch portion.

5. The nonvolatile latch circuit according to claim 4, wherein said current supply portion supplies a magnetization reversal current between said first terminal of said first magnetoresistance element and said first terminal of said second magnetoresistance element, and controls a direction of said magnetization reversal current based on data held by said latch circuit.

6. A nonvolatile latch circuit comprising:
a latch circuit configured to temporarily hold data;
a first magnetoresistance element and a second magnetoresistance element, each configured to include a first magnetic layer and a second magnetic layer that are stacked with an insulating film sandwiched therebetween; and
a current supply portion configured to complementarily changes magnetization states of said first magnetoresistance element and said second magnetoresistance element based on a state of said latch circuit,
wherein said first magnetic layer of said first magnetoresistance element and said first magnetic layer of said second magnetoresistance element are series-connected to each other in,
wherein said latch circuit has a function that brings data corresponding to said magnetization states to data held by said latch circuit, and
wherein said latch circuit includes:
a data holding circuit configured to perform positive feedback based on a first inverting circuit and a second inverting circuit,
a third switch portion configured to provided between an output terminal of said first inverting circuit and an input terminal of said second inverting circuit, and
a second switch portion configured to provided between an input terminal of second inverting circuit and a connection terminal where said first magnetoresistance element and said second magnetoresistance element are connected,
wherein said second switch portion is in ON state and said third switch portion is in OFF state in a recall operation recalling a memory information indicating said magnetization states stored in said first magnetoresistance element and said second magnetoresistance element.

7. The nonvolatile latch circuit according to claim 6, further comprising:
a third inverting circuit configured to be provided between said connection terminal and said second switch portion.

8. The nonvolatile latch circuit according to claim 7, wherein each of said first inverting circuit and said third switch portion is composed of a clocked inverter, and
wherein each of said third inverting circuit and said second switch portion is composed of a clocked inverter.

9. A logic circuit comprising:
a circuit configured to output data; and
a nonvolatile latch circuit configured to temporarily hold said data, wherein said nonvolatile latch circuit includes:
a latch circuit configured to temporarily hold said data,
a first magnetoresistance element and a second magnetoresistance element, each configured to include a first magnetic layer and a second magnetic layer that are stacked with an insulating film sandwiched therebetween, and
a current supply portion configured to complementarily changes magnetization states of said first magnetoresistance element and said second magnetoresistance element based on a state of said latch circuit,
wherein said first magnetic layer of said first magnetoresistance element and said first magnetic layer of said second magnetoresistance element are series-connected to each other in,
wherein said latch circuit has a function that brings data corresponding to said magnetization states to data held by said latch circuit, and
wherein a terminal on said second magnetic layer of said first magnetoresistance element is grounded and a terminal on said second magnetic layer of said second magnetoresistance element is connected to a power supply line through a switch portion.

10. The nonvolatile latch circuit according to claim 9, wherein said current supply portion supplies a magnetization reversal current to said first magnetoresistance element and said second magnetoresistance element such that said magnetization reversal current flows through said series-connection in a direction corresponding to a state of said latch circuit.

11. The nonvolatile latch circuit according to claim 9, wherein said latch circuit brings data corresponding to a voltage generated at a connection portion between said first magnetoresistance element and said second magnetoresistance element to data held by said latch circuit, when said magnetization reversal current flows from said power supply line to said ground through said first magnetoresistance element and said second magnetoresistance element.

12. A logic circuit comprising:
a circuit configured to output data; and
a nonvolatile latch circuit configured to temporarily hold said data, wherein said nonvolatile latch circuit includes:
a latch circuit configured to temporarily hold said data,
a first magnetoresistance element and a second magnetoresistance element, each configured to include a first magnetic layer and a second magnetic layer that are stacked with an insulating film sandwiched therebetween, and
a current supply portion configured to complementarily changes magnetization states of said first magnetoresistance element and said second magnetoresistance element based on a state of said latch circuit,
wherein said first magnetic layer of said first magnetoresistance element and said first magnetic layer of said second magnetoresistance element are series-connected to each other in,
wherein said latch circuit has a function that brings data corresponding to said magnetization states to data held by said latch circuit, and
wherein each of said first magnetoresistance element and said second magnetoresistance element includes:

a first terminal and a second terminal configured to be provided at both ends of said first magnetic layer, and a third terminal configured to be provided at an upper portion of said second magnetic layer, wherein said second terminal of said first magnetoresistance element and said second terminal of said second magnetoresistance element is connected to each other, wherein said third terminal of said first magnetoresistance element is grounded, and wherein said third terminal of said second magnetoresistance element is connected to a power supply line through a first switch portion.

13. The nonvolatile latch circuit according to claim 12, wherein said current supply portion supplies a magnetization reversal current between said first terminal of said first magnetoresistance element and said first terminal of said second magnetoresistance element, and controls a direction of said magnetization reversal current based on data held by said latch circuit.

14. A logic circuit comprising:

a circuit configured to output data; and a nonvolatile latch circuit configured to temporarily hold said data, wherein said nonvolatile latch circuit includes:

a latch circuit configured to temporarily hold said data, a first magnetoresistance element and a second magnetoresistance element, each configured to include a first magnetic layer and a second magnetic layer that are stacked with an insulating film sandwiched therebetween, and a current supply portion configured to complementarily changes magnetization states of said first magnetoresistance element and said second magnetoresistance element based on a state of said latch circuit, wherein said first magnetic layer of said first magnetoresistance element and said first magnetic layer of said second magnetoresistance element are series-connected to each other in, wherein said latch circuit has a function that brings data corresponding to said magnetization states to data held by said latch circuit, and wherein said latch circuit includes:

a data holding circuit configured to perform positive feedback based on a first inverting circuit and a second inverting circuit, a third switch portion configured to provided between an output terminal of said first inverting circuit and an input terminal of said second inverting circuit, and a second switch portion configured to provided between an input terminal of second inverting circuit and a connection terminal where said first magnetoresistance element and said second magnetoresistance element are connected, wherein said second switch portion is in ON state and said third switch portion is in OFF state in a recall operation recalling a memory information indicating said magnetization states stored in said first magnetoresistance element and said second magnetoresistance element.

15. The nonvolatile latch circuit according to claim 14, further comprising:

a third inverting circuit configured to be provided between said connection terminal and said second switch portion.

16. The nonvolatile latch circuit according to claim 15, wherein each of said first inverting circuit and said third switch portion is composed of a clocked inverter, and wherein each of said third inverting circuit and said second switch portion is composed of a clocked inverter.

* * * * *